United States Patent [19]

Nishihori et al.

[11] Patent Number: 5,670,808

[45] Date of Patent: Sep. 23, 1997

[54] METAL OXIDE CAPACITOR WITH A $WN_x$ ELECTRODE

[75] Inventors: Kazuya Nishihori, Tokyo; Yoshiaki Kitaura, Kawasaki; Yoshikazu Tanabe, Kawasaki; Tomonori Aoyama, Kawasaki; Kyoichi Suguro, Yokohama; Kumi Okuwada, Kawasaki; Shuichi Komatsu, Yokohama; Kazuhide Abe, Kawasaki, all of Japan

[73] Assignee: Kabushiki Kaisha Toshiba, Kawasaka, Japan

[21] Appl. No.: 591,153

[22] Filed: Jan. 25, 1996

[30] Foreign Application Priority Data

Jan. 30, 1995 [JP] Japan ................................. 7-012131
Jan. 10, 1996 [JP] Japan ................................. 8-002475

[51] Int. Cl.[6] ................................................. H01L 27/108
[52] U.S. Cl. .................... 257/310; 257/295; 257/764; 257/535; 361/305; 361/321.5; 361/322
[58] Field of Search ................................. 257/310, 295, 257/535, 764; 361/305, 321.5, 322

[56] References Cited

U.S. PATENT DOCUMENTS

| | | | |
|---|---|---|---|
| 5,187,557 | 2/1993 | Zenke | 257/310 |
| 5,283,462 | 2/1994 | Stengel | 257/595 |
| 5,440,174 | 8/1995 | Nishitsuji | 257/770 |
| 5,486,488 | 1/1996 | Kamiyama | 437/60 |

FOREIGN PATENT DOCUMENTS 58-97818  6/1983  Japan .
6-275776  9/1994  Japan .

OTHER PUBLICATIONS

"Low Leakage, Temperature Invariant, High Dielectric Constant Films, using Multilayered Sol-Gel Fabrication," IBM Technical Disclosure Bulletin, vol. 37, No. 9, Sep. 1994, p. 27.

Sandwip, et al., "Cubic Paraelectric (Nonferroelectric) Perovskite PLT Thin Films with High Permittivity for ULSI DRAM's and Decoupling Capacitors," IEEE Transactions on Electron Devices, vol. 39, No. 7, Jul. 1992, pp. 1607–1613.

Primary Examiner—Jerome Jackson
Assistant Examiner—John Guay
Attorney, Agent, or Firm—Oblon, Spivak, McClelland, Maier & Neustadt, P.C.

[57] ABSTRACT

A semiconductor device in which an $SiO_2$ film and a first wiring layer are arranged in this order on a GaAs substrate. A capacitor is formed on the first wiring layer. The capacitor includes a lower electrode which has a multi-layer structure consisting of a Ti layer, an Mo layer, and a Pt layer in this order from underside. The capacitor also includes a dielectric film made of strontium titanate. The capacitor further includes an upper electrode which has a multi-layer structure consisting of a $WN_x$ layer (120 um) and a W layer (300 nm) in this order from underside. That surface of the upper electrode, which is in contact with the dielectric film, is defined by the tungsten nitride layer.

6 Claims, 17 Drawing Sheets

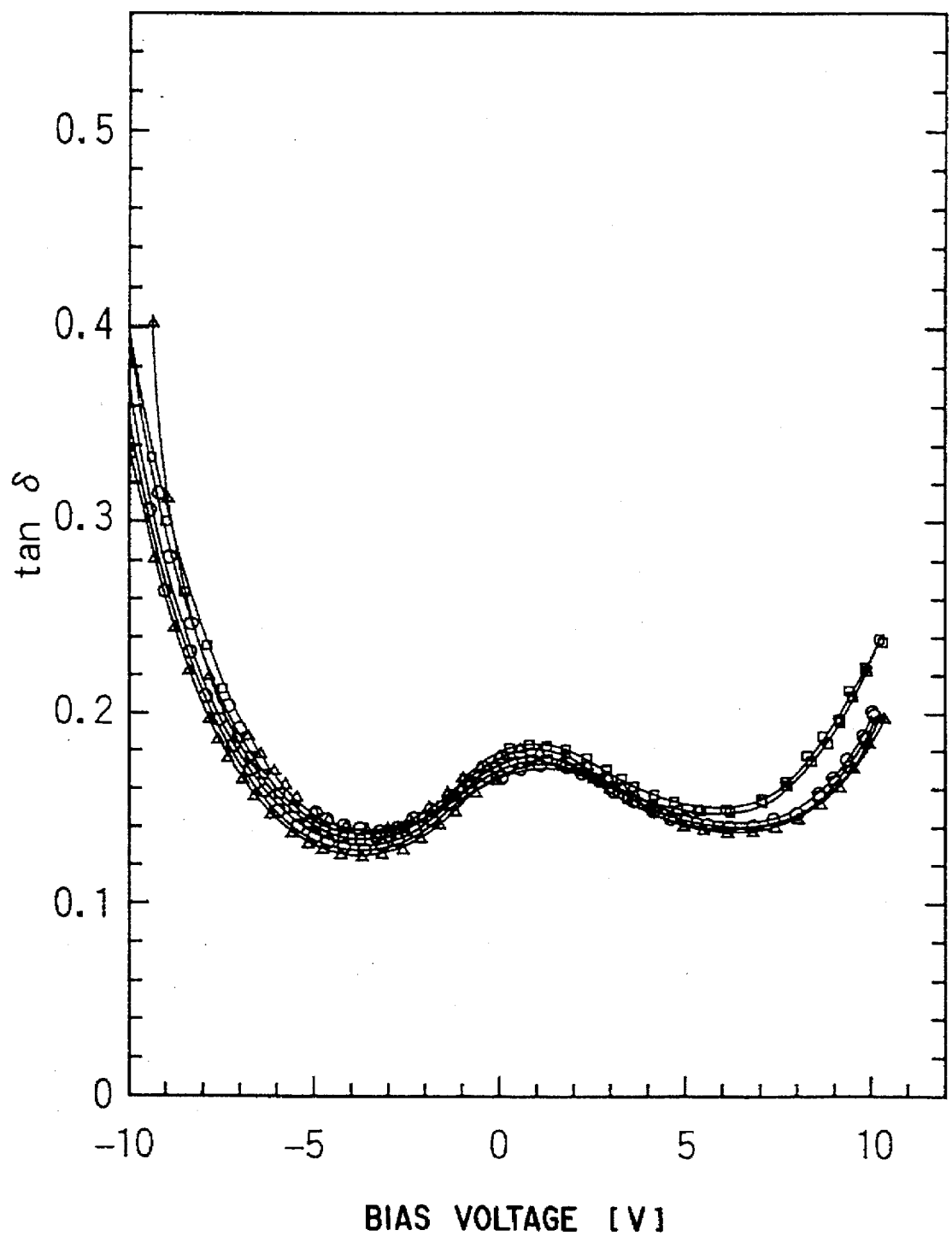
F I G. 4

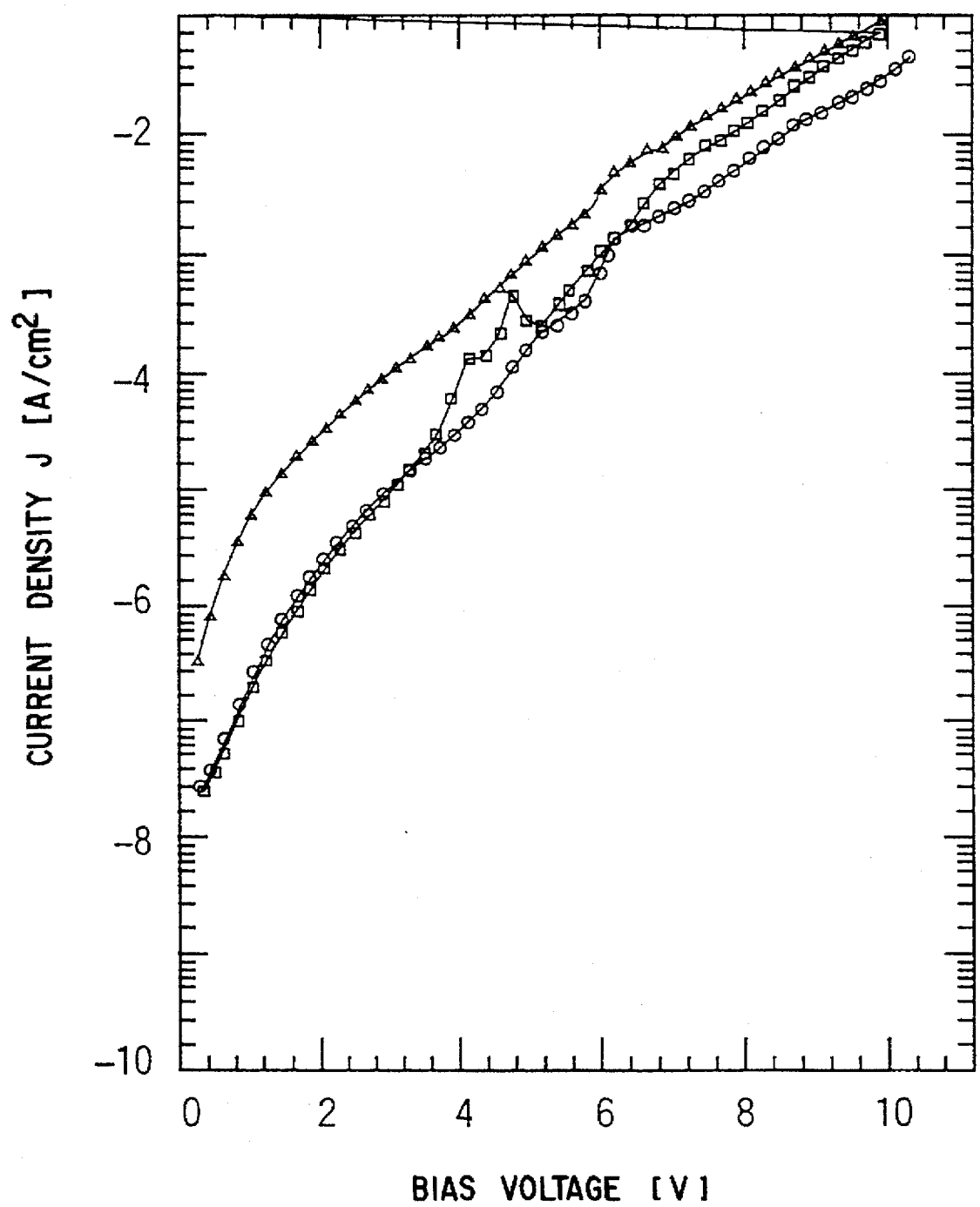
F I G. 7

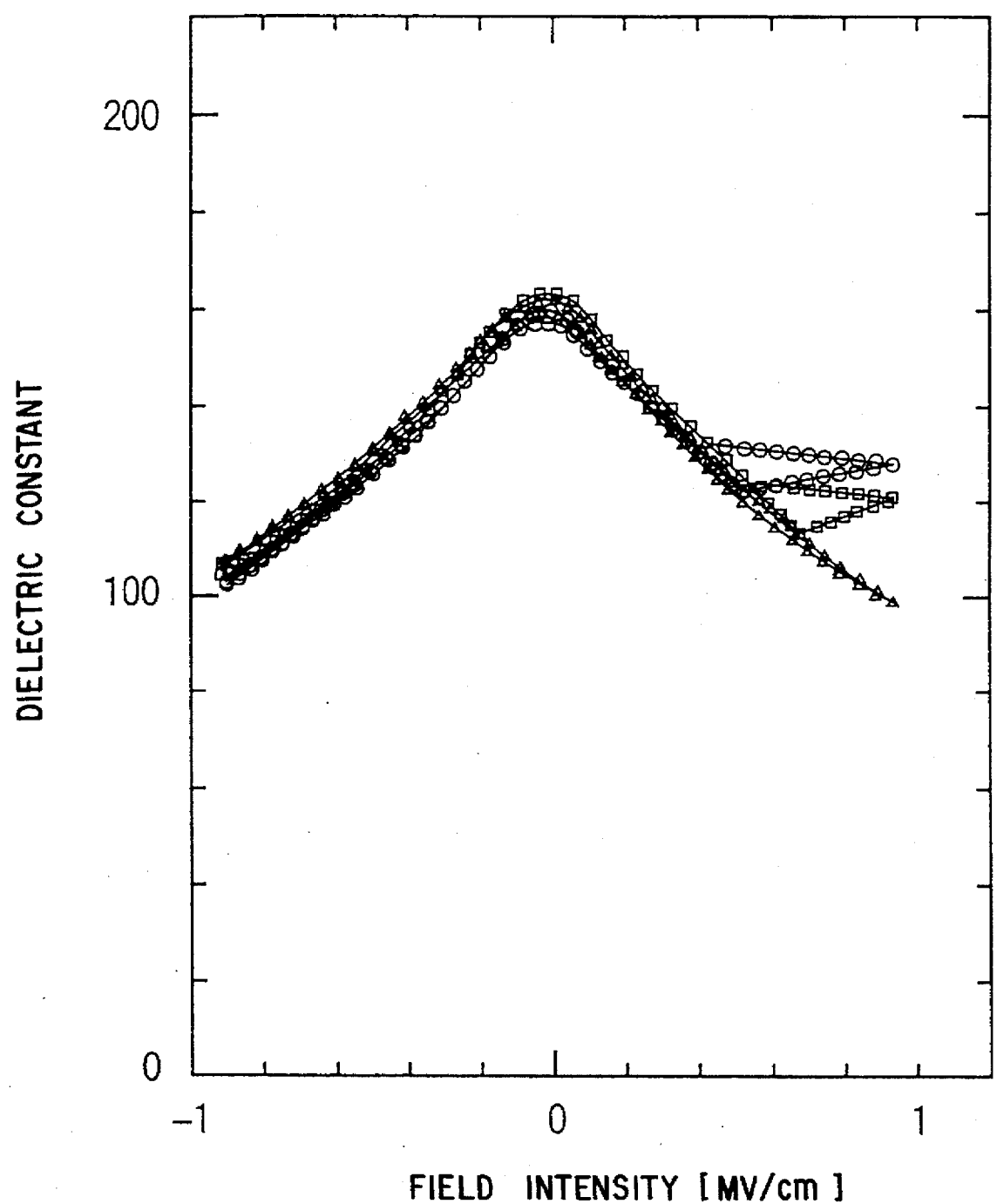
F I G. 9

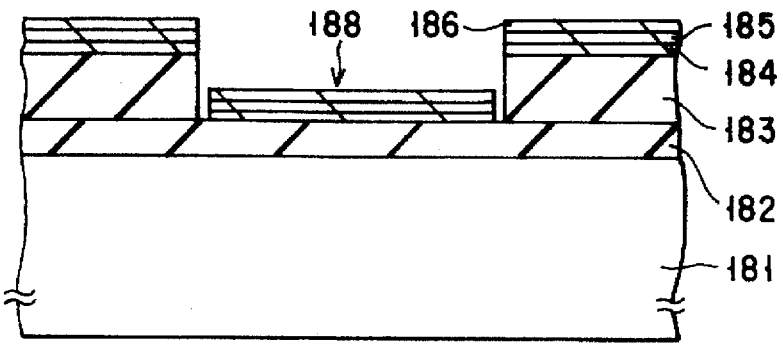
F I G. 29A
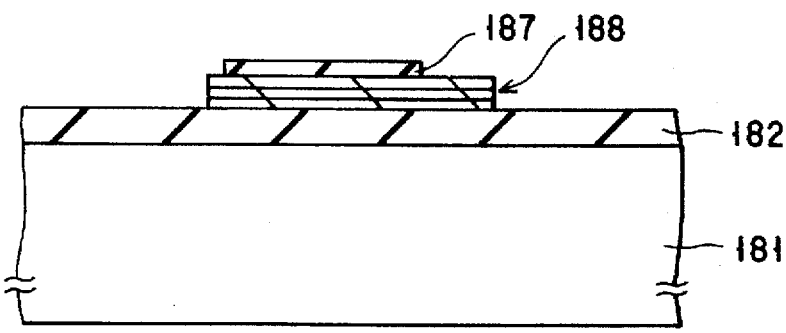
F I G. 29B
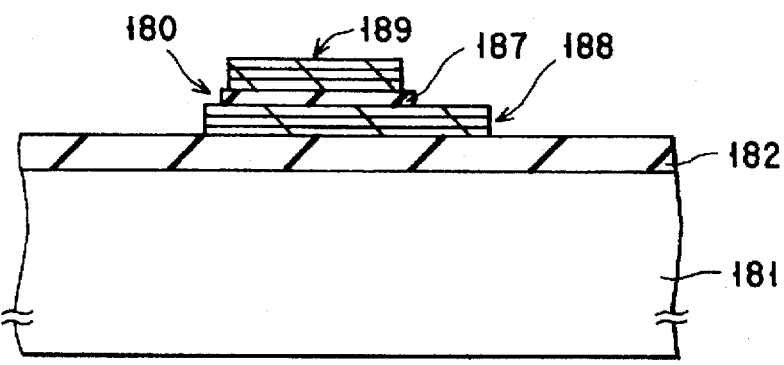
F I G. 29C
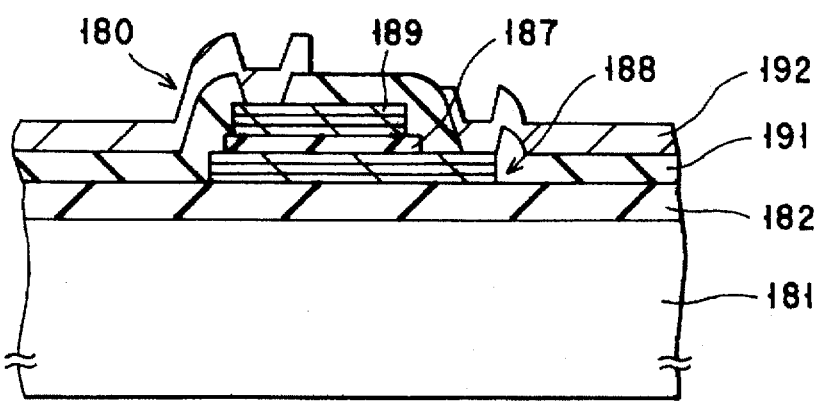
F I G. 29D

METAL OXIDE CAPACITOR WITH A $WN_x$ ELECTRODE

BACKGROUND OF THE INVENTION

1. Field of the Invention

The present invention relates to a semiconductor device having a capacitor which utilizes an oxide dielectric substance, such as a perovskite dielectric substance.

2. Description of the Related Art

Integrated circuits (ICs), which have been remarkably developed in recent years, include transistors and capacitors integratedly arranged in one semiconductor chip. One of the factors which determine the cost of an IC is the size of semiconductor chips. As the chip size is smaller, the cost of an IC becomes lower. In order to make the chip size smaller, it is important to decrease the area occupied by elemental devices in a semiconductor chip. Among the elemental devices, capacitors have the greatest occupation rate of area relative to the total chip area. Therefore, the chip size can be greatly decreased by making the area of each capacitor smaller.

Generally, an MIM (Metal Insulator Metal) capacitor structure, in which a dielectric thin film is interposed between electrode thin films, is adopted in a capacitor to be used in an IC, for the purpose of miniaturization and so forth. The capacitance C of an MIM capacitor is expressed by $C=(\epsilon_r \times \epsilon_0 \times S)/d$, where $\epsilon_r$ is the relative dielectric constant of the dielectric film, $\epsilon_0$ is the dielectric constant of vacuum, S is the electrode area, and $\underline{d}$ is the thickness of the dielectric film.

Therefore, it is necessary for decreasing the electrode area of a capacitor to increase the relative dielectric constant of its dielectric film or to decrease the thickness of the film. However, there is a limit in the thickness of the dielectric film, since leakage current becomes greater as the dielectric film is thinner. Furthermore, where the thickness of the dielectric film is small, it is difficult to control the thickness in a manufacturing process, thereby bringing about irregularity in the characteristics of capacitors.

In relation to increase in the relative dielectric constant, it has been proposed to use, as the material of the dielectric thin film, a perovskite dielectric substance, which has a high dielectric constant, in place of $SiO_2$, SiN, or SiON conventionally used. Strontium titanate (STO) expressed by a chemical formula of $SrTiO_3$ and barium strontium titanate (BSTO) expressed by a chemical formula of $BaSrTiO_3$ are representative ones of the perovskite dielectric substances.

A semiconductor memory device, represented by a DRAM, memorizes data by storing electric charge in a number of capacitors. Therefore, decrease in the area of each capacitor greatly facilitates increase in degree of integration level. In other words, it is effective for improving the degree of integration level to increase the dielectric constant of the dielectric film.

In a GaAs monolithic microwave IC (MMIC) which has attracted attention due to its application to a poratable telephone, a capacitor having a large capacitance is sometimes used for decoupling between a power supply and an impedance matching circuit. In such an IC, the chip size can be decreased by increasing the dielectric constant of a dielectric film and decreasing the electrode area.

FIG. 2 is a cross sectional view showing a conventional capacitor employed in an MMIC. This capacitor is manufactured as follows.

An $SiO_2$ film 2 is formed on a GaAs substrate 1. A first wiring layer 3 made of Au or the like is formed on the $SiO_2$ film 2 by means of a lift-off method.

Then, a metal film to be a lower electrode 4 is formed on the first wiring layer 3 by means of a lift-off method. An STO dielectric film 5 is deposited on the lower electrode 4 by means of a reactive sputtering method at about 300° C. An upper electrode 6 is formed on the dielectric film 5 by means of a lift-off method. The STO dielectric film 5 is patterned by means of wet etching, using the upper electrode 6 as a mask.

Then, an $SiO_2$ film 7 as an inter-level insulator is deposited and a contact hole is formed. A second wiring layer 8 made of Au or the like is then formed.

In such a capacitor, its characteristics are degraded due to oxidation of those surfaces of the lower and upper electrodes 4 and 6, which are in contact with the dielectric film 5. As the material of the electrodes 4 and 6, Ti is used, since it has an excellent adhesion. In this case, the upper surface of the lower electrode 4 is oxidized in the step of depositing the dielectric film 5, which is carried out in an atmosphere containing oxygen. The lower surface of the upper electrode 6 is oxidized when the upper electrode 6 is formed.

If those surfaces of the electrodes 4 and 6, which are in contact with the STO dielectric film 5, are oxidized, a metal oxide produced by this oxidation act as a dielectric substance having a low relative dielectric constant. In this case, a capacitor having a relatively low capacitance due to the metal oxide is connected in serial to a capacitor having a high capacitance due to the STO film, as in an equivalent circuit. As a result, the total capacitance of a capacitor formed between lower and upper electrodes 4 and 6 becomes low.

Generally, the oxide layer formed in the lower part of the upper electrode 6 is thinner than the oxide layer formed in the upper part of the lower electrode 6. As a result, where the upper and lower polarities of applied voltage are reversed, the electric characteristics may differ. In order to decrease this difference, an additional oxide is produced in the upper electrode on purpose so that the oxide layers in the lower and upper electrodes 4 and 6 balance with each other. However, this brings about the decrease in dielectric constant described above.

It is known that the crystallinity of an STO film is improved and its dielectric constant is increased by heat-treating the film at a temperature as high as 600° C. or more. Therefore, when capacitor electrodes are selected, their heat resistance should be taken into account. In Jpn. Pat. Appln. KOKAI Publication No. 59-97818, nitride, silicide, or carbide of a metal, such as Ti, Ta, Nb, Hf, Zr or the like is used, in place of a single metal, such as Ti or the like, as the material of an electrode, in order to improve the heat resistance of the electrode. However, it has been found that where these materials are applied to a capacitor employing an oxide dielectric film, such as an STO film, and having a high capacitance, their oxidation resistance is not enough so that a metal oxide is produced and the capacitor is decreased in its capacitance. Furthermore, these materials have a high electric resistance and do not suit for the electrode material of a capacitor used in an MMIC.

Precious metals, such as gold and platinum, have an excellent oxidation resistance. However, these materials are not appropriate for an IC, since they are expensive, and are hard to pattern by means of a reactive dry etching method. Furthermore, they are thermally unstable, and properties, such as dielectric dispersion, are irregular. FIG. 5 is a graph showing dielectric dispersion relative to bias voltage in a capacitor having an STO dielectric film interposed by Pt electrodes. In this graph, different three marks respectively represent different three measured points in one plane. As shown in FIG. 5, hysteresis occurs relative to the bias voltage at respective measured points. This means that two dielectric dispersion values are produced in relation to one applied voltage, whereby no stable electric properties can be obtained.

SUMMARY OF THE INVENTION

It is an object of the present invention to provide a semiconductor device having a capacitor which occupies less area, by preventing the capacitor from decreasing in its capacitance due to oxidation of its electrode surface.

It is another object of the present invention to provide a semiconductor device having a capacitor which has electric characteristics entailing no hysteresis.

According to a first aspect of the present invention, there is provided a semiconductor device comprising a capacitor having first and second electrodes, and a dielectric film made of an oxide, interposed between the electrodes wherein the first electrode is in contact with the dielectric film by a first contacting surface including tungsten nitride.

According to a second aspect of the present invention, there is provided a semiconductor device comprising:
  a semiconductor substrate;
  a field effect transistor arranged on the substrate, the transistor having source and drain diffusion layers formed in the substrate, and a Schottky gate electrode arranged on the substrate between the source and drain diffusion layers; and a capacitor supported by the substrate and having first and second electrodes, and a dielectric including an oxide film interposed between the first and second electrodes, the first electrode being electrically connected to the Schottky gate electrode,
  wherein the Schottky gate electrode and first electrode are formed by patterning a common material film having upper and lower surface including tungsten nitride, the Schottky gate electrode is in contact with the substrate by a contacting surface derived from the lower surface and including tungsten nitride, and the first electrode is in contact with the dielectric film by a first contacting surface derived from the upper surface and including tungsten nitride.

According to a third aspect of the present invention, there is provided a semiconductor memory device comprising:
  a semiconductor substrate;
  a field effect transistor arranged on the substrate and functioning as a transfer gate, the transistor having source and drain diffusion layers formed in the substrate, and a gate electrode arranged on the substrate via a gate insulating film between the source and drain diffusion layers; and
  a storage capacitor supported by the substrate and connected to the transfer gate, the capacitor having first and second electrodes, and a dielectric made of an oxide film interposed between the first and second electrodes,
  wherein the first electrode is in contact with the dielectric film by a first contacting surface including tungsten nitride.

According to the present invention, since at least one of the capacitor electrodes is provided with a $WN_x$ layer on a side in contact with a dielectric film, it is possible for the capacitor to have increased capacitance, to suppress dielectric dispersion, to decrease irregularity in electric characteristics, and to suppress hysteresis.

In consideration of a circuit design, a capacitor should not have polarity. Therefore, both capacitor electrodes are preferably provided with a contacting surface formed of tungsten nitride, so that the capacitor electrodes have the same work function.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph showing a relationship between bias voltage and dielectric dispersion (tan δ) in the semiconductor device shown in FIG. 1;

FIG. 7 is a graph showing a relationship between bias voltage and leakage current density in the conventional semiconductor device;

FIG. 9 is a graph showing a relationship between electric field intensity and relative dielectric constant in the conventional semiconductor device;

FIGS. 29A to 29D are cross sectional views showing a method in order of manufacturing a semiconductor device according to still another embodiment of the present invention.

DETAILED DESCRIPTION OF THE PREFERRED EMBODIMENTS

Figure 1:
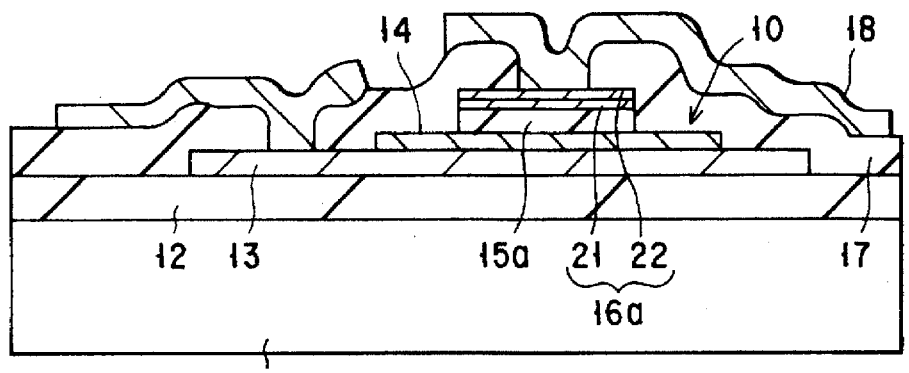
FIG. 1 is a cross sectional view showing a semiconductor device according to an embodiment of the present invention.
Figure 2:
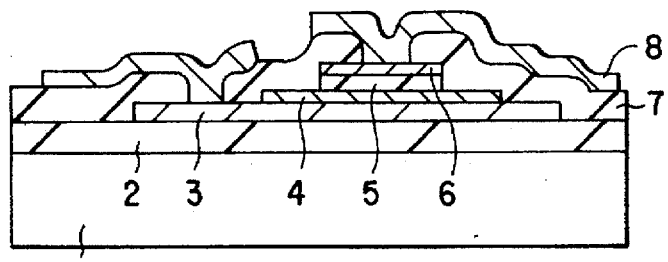
FIG. 2 is a cross sectional view showing a conventional semiconductor device.

FIG. 1 is a cross sectional view showing a semiconductor device (capacitor used in an MMIC) according to an embodiment of the present invention.

An $SiO_2$ film 12 and a first wiring layer 13 are arranged in this order on a GaAs substrate 11. A capacitor 10 is formed on the first wiring layer 13. The capacitor 10 includes a lower electrode 14 which has a multi-layer structure consisting of a Ti layer (5 nm), an Mo layer (50 nm), and a Pt layer (400 nm) in this order from underside. The capacitor 10 also includes a dielectric film 15a made of strontium titanate (STO). The capacitor 10 further includes an upper electrode 16a which has a multi-layer structure consisting of a $WN_x$ (tungsten nitride) layer 21 (120 nm) and a W layer 22 (300 nm) in this order from underside. In other words, that surface of the upper electrode 16a, which is in contact with the dielectric film 15a, is defined by the tungsten nitride layer 21, which is a characteristic point of the present invention.

Other than STO, a highly dielectric substance of metal oxide, such as $Ba_xSr_{1-x}TiO_3$ (BSTO), $Ta_2O_5$, $PbZr_xTi_{1-x}O_3$, or $Pb_xLa_{1-x}Zr_yTi_{1-y}O_3$ may be used as the material of the dielectric film 15a. Note that a perovskite dielectric substance of the paraelectric type, even if its dielectric constant is a little low, is better for a capacitor used in an MMIC than a dielectric substance of the ferroelectric type which has a less excellent frequency property, since an MMIC is conceived to be used at a frequency 800 MHz or more.

Tungsten nitride is more stable than other metal nitrides, such as a nitride of Ti, Ta, Nb, Hf, Zr or the like. The standard formation energy of other metal nitrides, such as a nitride of Ti, Ta, Nb, Hf, Zr or the like, is less than $-400$ kJ/mol$N_2$ at 600K, while that of tungsten nitride is $-100$ kJ/mol$N_2$ at 600K. Therefore, tungsten nitride has a stable property and an excellent oxidation resistance and is suitable for an electrode material to be used with an oxide dielectric substance. In addition, tungsten nitride can be patterned by means of a reactive dry etching method, which is carried out for manufacturing a semiconductor IC.

Figure 3:
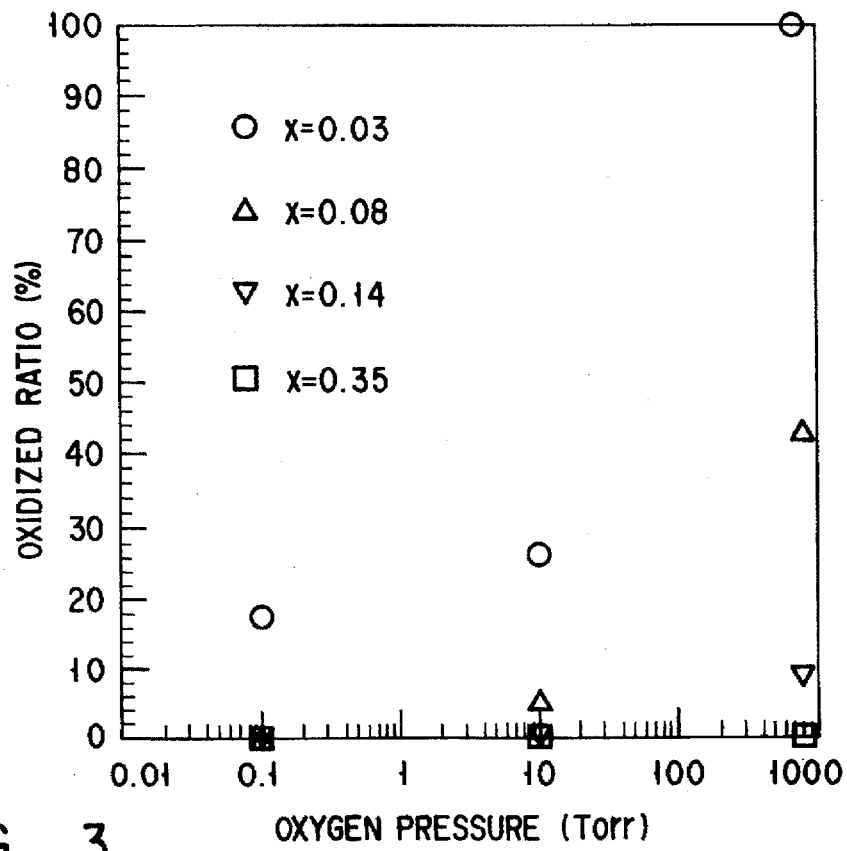
FIG. 3 is a graph showing a relationship between the coefficient $\underline{x}$ of $WN_x$ and its oxidation resistance.

FIG. 3 shows an experimental result of researching into a relationship between the coefficient $\underline{x}$ of $WN_x$ and its oxidation resistance. In this experiment, $WN_x$ samples having a thickness of 120 nm and different values of the coefficient $\underline{x}$ were heated at 450° C. in an $O_2$ atmosphere for 30 minutes. As shown in FIG. 3, as the coefficient $\underline{x}$ grows higher, the oxidized ratio of the $WN_x$ samples (the ratio in thickness of the oxidized layer to each $WN_x$ sample which was 120 nm) becomes lower, or the oxidation resistance becomes higher.

FIG. 4 shows an experimental result of researching into a relationship between bias voltage and dielectric dispersion (tan δ) in an example of the capacitor shown in FIG. 1. The tan δ represents a rate of electric energy lost as heat when alternating electric field is applied. In this graph, different three marks respectively represent different three measured points in the example. As shown in FIG. 4, no hysteresis occurred relative to the bias voltage in the example, so that one applied voltage value was provide with one dispersion value and uniform values were obtained among the measured points. This means that the capacitor can offer excellent characteristics entailing no hysteresis.

Figure 5:
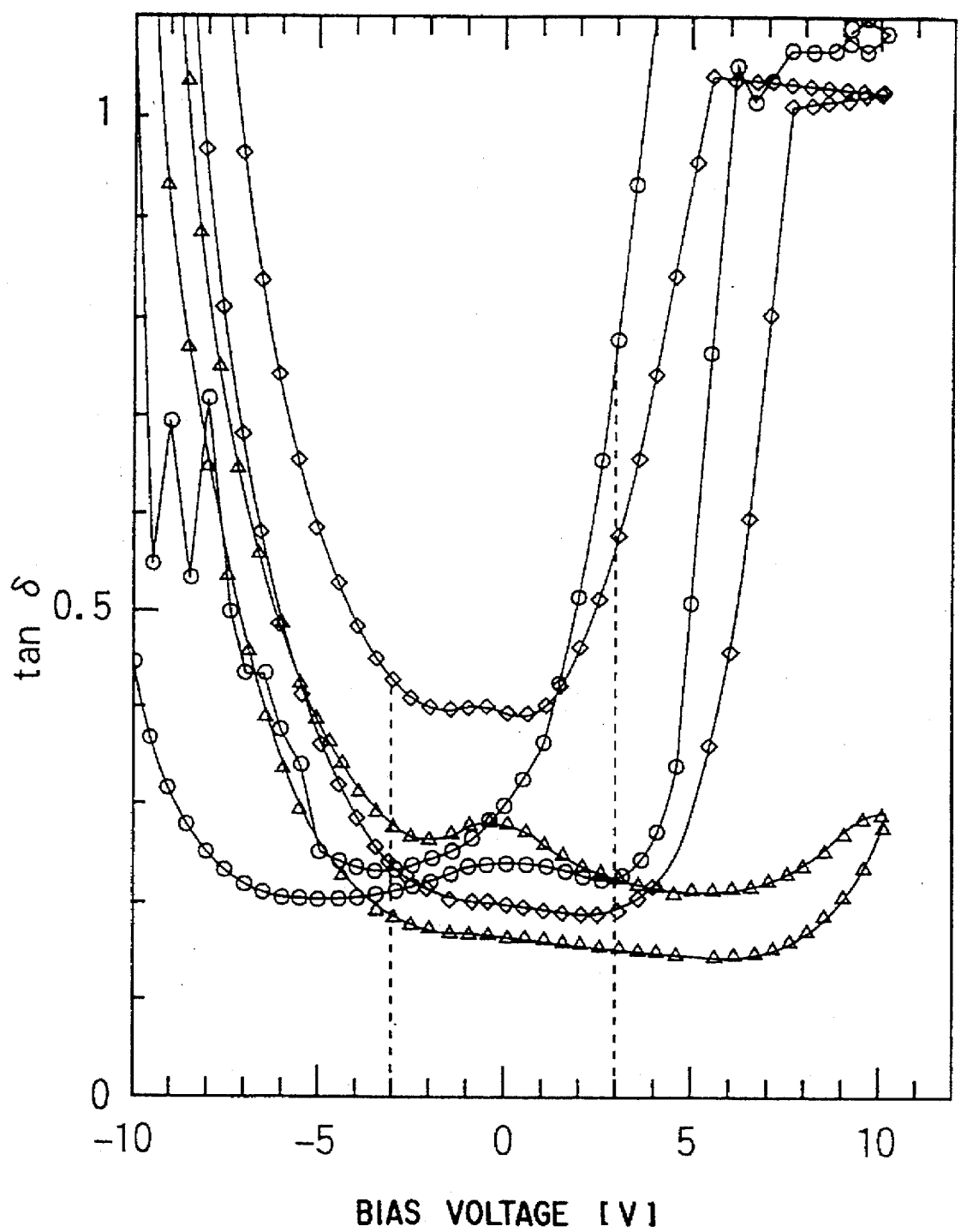
FIG. 5 is a graph showing a relationship between bias voltage and dielectric dispersion (tan δ) in the conventional semiconductor device.

FIG. 5 shows an experimental result of researching into a relationship between bias voltage and dielectric dispersion (tan δ) in a comparative example of a capacitor. The comparative example was formed to have the same structure as the capacitor shown in FIG. 1, except that both the upper and lower electrodes were made of Pt. As shown in FIG. 5, hysteresis occurred relative to the bias voltage in the comparative example. The hysteresis suggests that an unstable substance was irreversibly produced at the interface between the electrode and STO film when the bias voltage was applied.

Furthermore, as shown in FIG. 4, the example of the present invention showed almost no difference in measured values among the three points. This suggests that the interface between the $WN_x$ electrode and STO film was stable. In contrast, as shown in FIG. 5, the comparative example showed a large difference in measured values among the three points. This suggests that an unstable substance was produced at the interface between the Pt electrode and STO film, so that some characteristics of the capacitor were degraded.

Figure 6:
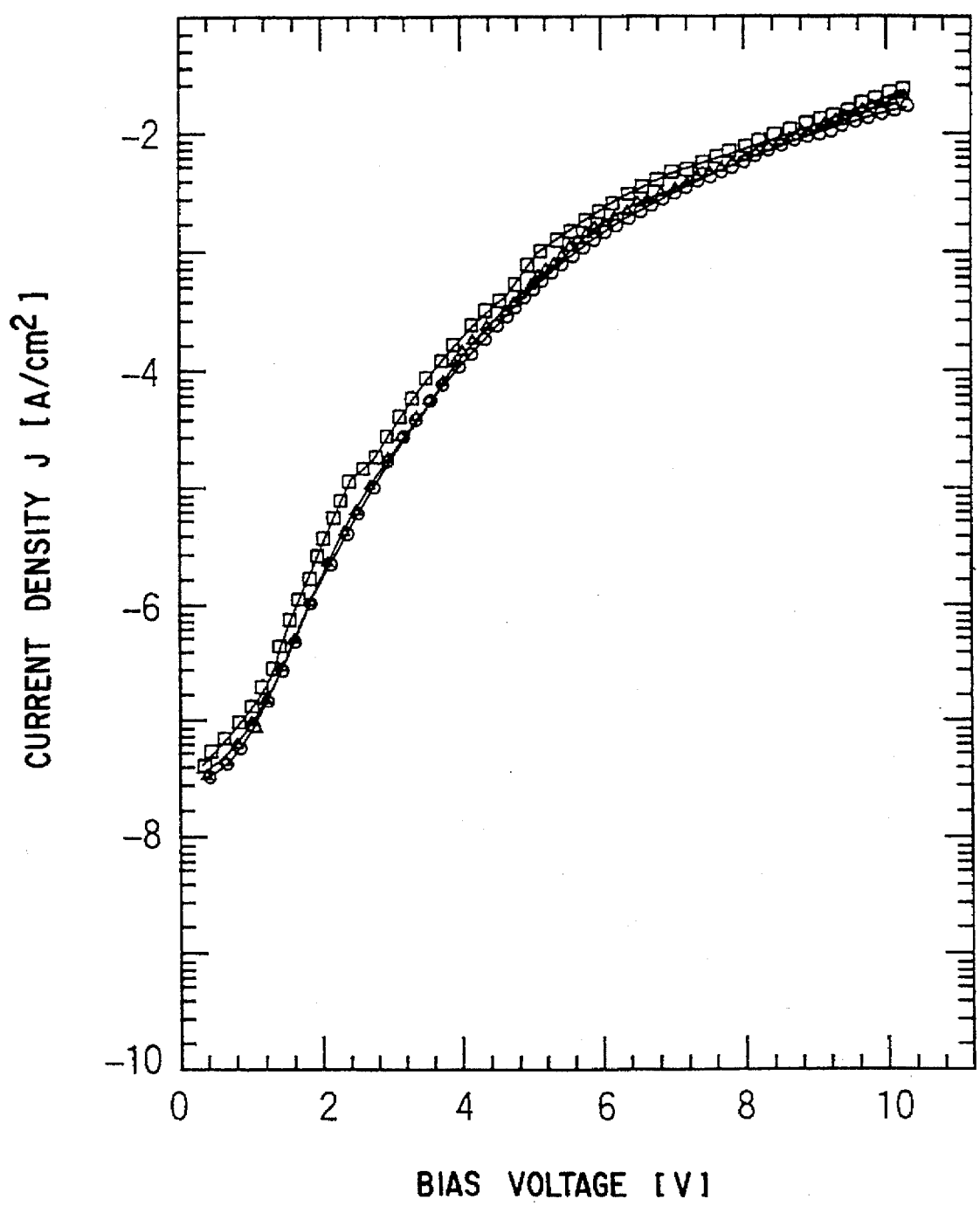
FIG. 6 is a graph showing a relationship between bias voltage and leakage current density in the semiconductor device shown in FIG. 1.

The difference or irregularity in characteristics among the measured points described above can be observed in an experimental result of measuring leakage current when bias voltage was applied. FIGS. 6 and 7 show leakage current in the example of the present invention and the comparative example, respectively. In the comparative example using the Pt electrode, measured values of the leakage current differed among the measured points.

The capacitor shown in FIG. 1 is improved about hysteresis relative to bias voltage, and about irregularity in characteristics among measure points. Furthermore, the capacitor shown in FIG. 1 is excellent in absolute values of characteristics. As shown in FIG. 4, the dielectric dispersion was 2% or less where the bias voltage was 3 V or less. On the other hand, as shown in FIG. 5, the dielectric dispersion was 4% to 7% where bias voltage was 3 V or less. This difference became enlarged where the bias voltage was higher. Where the dielectric dispersion is small, loss is decreased so that a preferable capacitor is provided.

Figure 8:
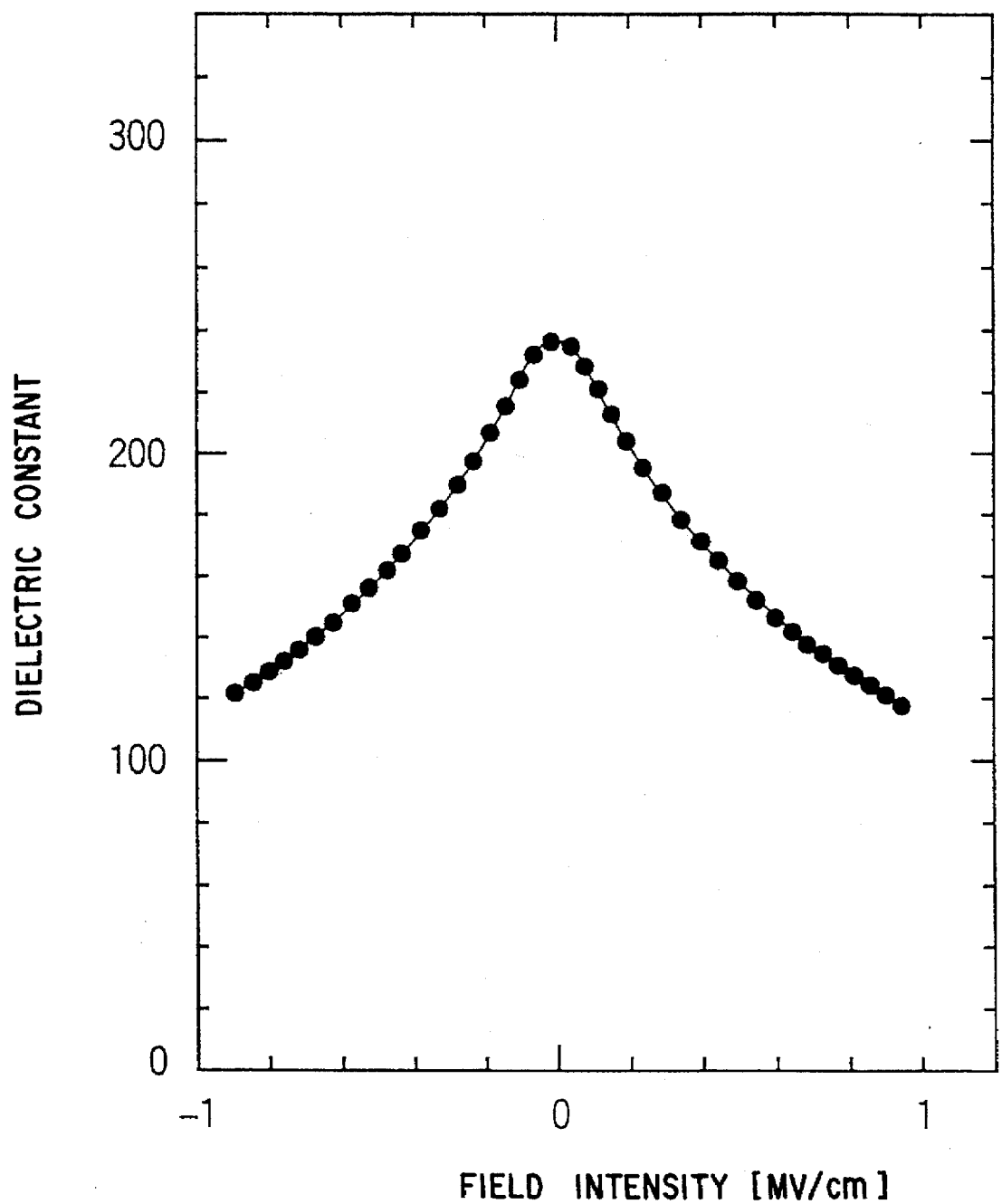
FIG. 8 is a graph showing a relationship between electric field intensity and relative dielectric constant in the semiconductor device shown in FIG. 1.

As shown in FIG. 9, the maximum value of dielectric constant was 160 in the comparative example, while, as shown in FIG. 8, the maximum value of dielectric constant was 1.5 times or 240 (bias voltage=0) in the example of the present invention. Since the STO film of the example was formed at 300° C., the dielectric constant value of 240 is the best level in consideration of this temperature. The dielectric constant can be further increased by a heat treatment performed at a temperature as high as 600° C. to 700° C.

As has been described, characteristics of a capacitor can be improved by arranging the $WN_x$ layer 21 in that surface of the upper electrode 16a, which is in contact with the dielectric film 15a. Where a $WN_x$ layer is arranged in the upper surface of the lower electrode 14, which is exposed to a severe oxidation atmosphere when the STO film is formed, characteristics of the capacitor can be further improved. In an experiment conducted by the present inventors, where the upper and lower electrodes of a capacitor employing an STO film were made of titanium nitride, they were oxidized up to a deep portion, and the capacitance of the capacitor was almost the same as that of a capacitor employing an $SiO_2$ film.

FIGS. 10A to 10D are cross sectional views showing a method in order of manufacturing the semiconductor device shown in FIG. 1.

Figure 10A:
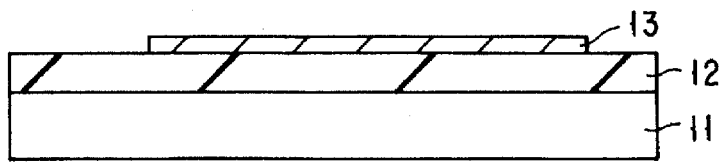
FIGS. 10A to 10D are cross sectional views showing a method in order of manufacturing the semiconductor device shown in FIG. 1.

At first, the $SiO_2$ film 12 is formed on the GaAs substrate by means of a CVD (Chemical Vapor Deposition) method. The first wiring layer 13 made of a metal, such as Au, is then formed by means of a lift-off method (FIG. 10A).

Figure 10B:
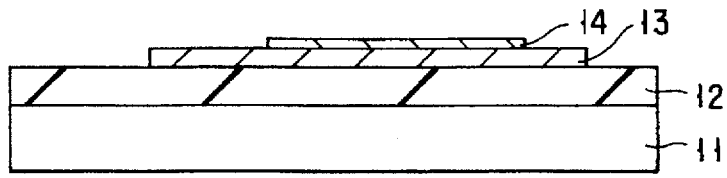

Then, a multi-layer film consisting of the Ti layer (5 nm), the Mo layer (50 nm), and the Pt layer (400 nm) in this order from underside is formed on the first wiring layer 13 by means of an E-GUN method. The multi-layer film is patterned, using a resist pattern formed by means of photolithography as a mask, and the lower electrode 14 is formed by means of a lift-off method (FIG. 10B).

Figure 10C:
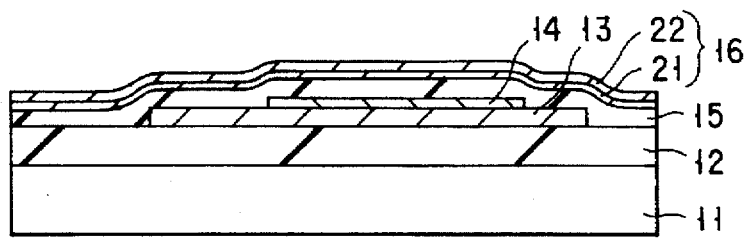

Then, an STO film 15 is deposited up to 100 nm on the lower electrode 14 by means of a reactive sputtering method performed in an oxygen atmosphere. A multi-layer film 16 consisting of the $WN_x$ layer 21 (120 nm) and the W layer 22 (300 nm) in this order from underside is then deposited by means of a reactive sputtering method with the substrate heated at 300° C. (FIG. 10C).

Figure 10D:
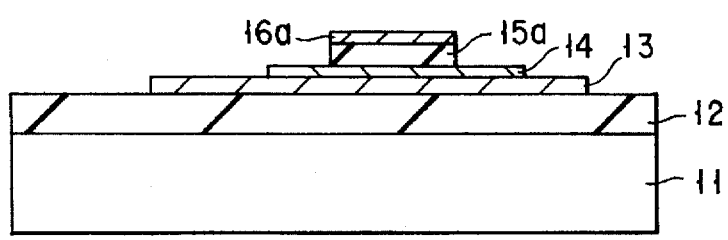

Then, the STO film 15 and multi-layer film 16 are patterned by means of a reactive ion etching method, using a resist pattern formed by means of photolithography as a mask, so that the dielectric film 15a and upper electrode 16a are formed (FIG. 10D). The $WN_x$ layer 21 is employed at that part of the upper electrode, which is in contact with the dielectric film 15a.

Then, an inter-level insulating film 17 made of, e.g., $SiO_2$ is deposited up to 600 nm by means of a CVD method. Contact holes are then formed by means of an RIE method, and wiring layers 18 made of, e.g., Au are connected to the upper and lower electrodes, so that the capacitor 10 is electrically connected to other elemental devices in the IC (FIG. 1).

Since the lower part of the multi-layer film 16 to be the upper electrode 16a is formed of the $WN_x$ layer 21, a reaction product is hardly produced at the interface between the multi-layer film 16 and STO film 15 when the multi-layer film 16 is formed. Where $TiN_x$ was used in place of $WN_x$, the dielectric constant of the device was lowered down to one tenth or less.

The lower electrode 14 may preferably be provided with $WN_x$, though only the upper electrode 16a includes $WN_x$ in the device shown in FIG. 1. In this case, patterning of all the lower electrode 14, dielectric film 15a, and upper electrode 16a can be performed by means of RIE, so that the manufacturing process is simplified, and miniaturization is achieved.

Figure 11A:
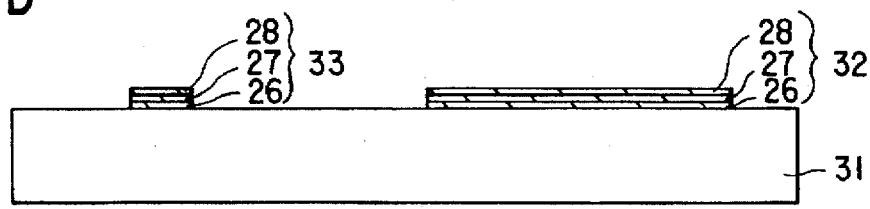
FIGS. 11A to 11C are cross sectional views showing a method in order of manufacturing a semiconductor device according to another embodiment of the present invention.
Figure 11B:
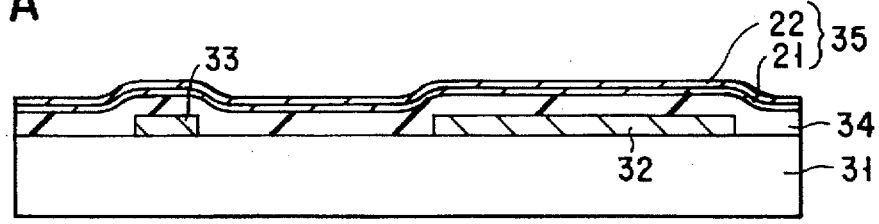
Figure 11C:
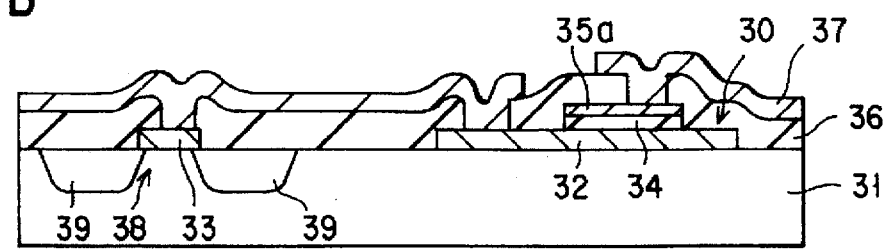

FIGS. 11A to 11C are cross sectional views showing a method in order of manufacturing a semiconductor device according to another embodiment of the present invention. This embodiment relates to an MMIC in which $WN_x$ is employed in the lower electrode of a capacitor and the gate electrode of an FET.

At first, a multi-layer film to be the electrodes is formed on a GaAs substrate 31 by means of a cold sputtering method. The multi-layer film consists of a $WN_x$ layer 26 (120 nm), a W layer 27 (300 nm), and a $WN_x$ layer (120 nm) in this order from underside. The multi-layer film is patterned by means of RIE, using a resist pattern (not shown), so that a gate electrode 33 of an FET and a lower electrode 32 of an MIM capacitor are formed at a time (FIG. 11A). The reason why the upper and lower layers of the electrodes 32 and 33 are made of $WN_x$ is that this material is excellent as a material of the Schottky gate electrode and the lower electrode of a capacitor.

Then, an STO film 34 (100 nm) is deposited by means of a reactive sputtering method performed in an oxygen atmosphere. A multi-layer film 35 consisting of a $WN_x$ layer 21 (120 nm) and a W layer 22 (300 nm) in this order from underside is then deposited by means of a reactive sputtering method with the substrate heated at 300° C. (FIG. 11B).

Then, the STO film 34 and multi-layer film 35 are patterned by means of a reactive ion etching method, so that a dielectric film 34a and an upper electrode 35a are formed. The capacitor is then heat-treated at 500° C. so as to facilitate crystallization of STO. After that, steps for forming the FET 38 are carried out.

Then, an inter-level insulating film 36 made of, e.g., $SiO_2$ is deposited up to 600 nm. Contact holes are then formed and wiring layers 37 are arranged (FIG. 11C). In this step, openings (not shown) are formed in the inter-level insulating film 36 down to source/drain diffusion layers 39 of the transistor 38 by means of an RIE method. Ohmic electrodes are then arranged by forming a film made of a metal or alloy, such as AuGe, by means of a lift-off method, using the inter-level insulating film 36 having the openings as a spacer.

In this embodiment, the dielectric film 34a and upper electrode 35a of the capacitor 30 are formed before formation of the ohmic electrode made of, e.g., AuGe, which would be deteriorated at a temperature of 400° C. or more. Sequentially, thermal stability of the $WN_x$ electrode is utilized so that the capacitor is heat-treated at a temperature of 400° C. or more, and preferably of 600° C. or more. By performing this heat treatment, crystallization of STO and decrease in oxygen deficiency proceed so that the dielectric constant of the device is improved. This heat treatment may be performed after the STO film is formed overall and before the upper electrode is formed. Instead, this heat treatment may be performed along with a heat treatment for activating an ion-implanted layer of the FET in common. In this case, the heat treatment is carried out at a temperature at about 800° C.

According to a conventional method, the transistor is formed before the capacitor is formed, and thus no heat treatment of the dielectric film can be performed for fear of deteriorating the ohmic electrode. In addition, where the heat resistance of the upper and lower electrodes are inferior, no heat treatment of the dielectric film can be performed. In contrast, however, where $WN_x$ is employed in the Schottky gate electrode and capacitor electrode, and the MIM capacitor is formed in advance, it is possible to heat-treat the dielectric film in order to improve the dielectric constant.

Figure 12A:
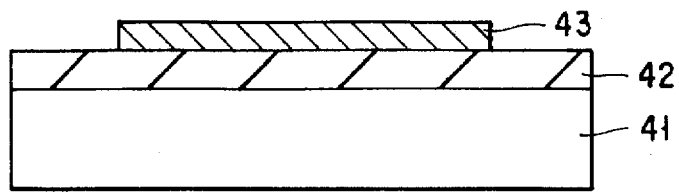
FIGS. 12A to 12C are cross sectional views showing a method in order of manufacturing a semiconductor device according to still another embodiment of the present invention.
Figure 12B:
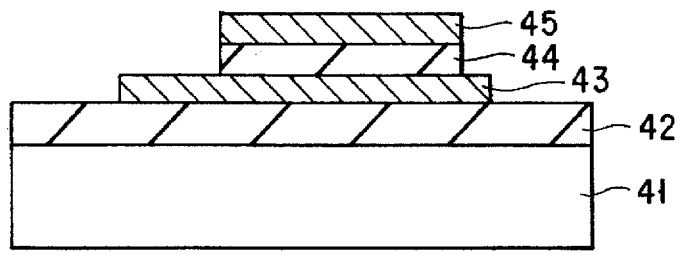
Figure 12C:
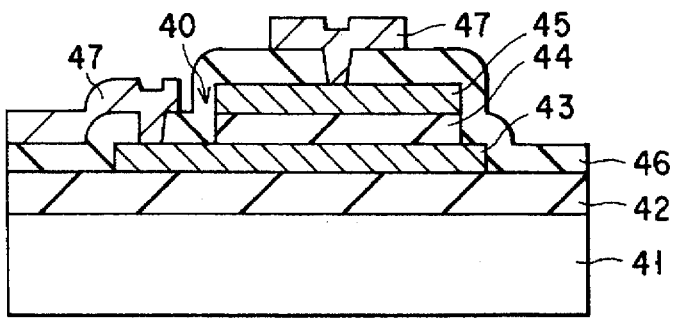

FIGS. 12A to 12C are cross sectional views showing a method in order of manufacturing a semiconductor device (capacitor used in an MMIC) according to still another embodiment of the present invention.

At first, a $WN_x$ film to be a lower electrode is formed on an $SIO_2$ film 42 arranged on a semiconductor substrate 41 by means of a reactive sputtering method. The $WN_x$ film is selectively removed by means of RIE, using a photo-resist mask, so that a lower electrode 43 is formed. Then, a heat treatment is carried out in an ammonia gas atmosphere so that a predetermined nitriding rate is achieved (FIG. 12A).

In this heat treatment, nitrogen is diffused into the surface of the lower electrode 43 so as to further increase its nitriding rate and to improve its oxidation resistance. By doing so, it is possible to hardly produce an oxide which lowers the capacitance of the capacitor in the step of forming the dielectric film. Furthermore, crystallinity of the electrode material is improved and a stable electrode can be obtained.

Then, an STO film to be a dielectric film 44 and $WN_x$ film to be an upper electrode 45 are deposited on the lower electrode 43, and their unnecessary parts are removed by means of RIE. By doing so, a capacitor 40 having the lower electrode 43, dielectric film 44, and upper electrode 45 is arranged (FIG. 12B).

Then, an inter-level insulating film 46 made of, e.g., $SiO_2$ is deposited, and contact holes are formed therein. Wiring layers 47 made of, e.g., Au are connected to the lower and upper electrodes 43 and 45, so that the capacitor 40 is electrically connected to other elemental devices in the MMIC (FIG. 12C).

Figure 13:
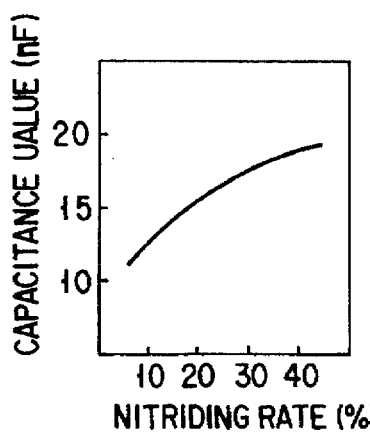
FIG. 13 is a graph showing a relationship between nitriding rate and capacitance in the semiconductor device shown in FIGS. 12A to 12C.
Figure 14:
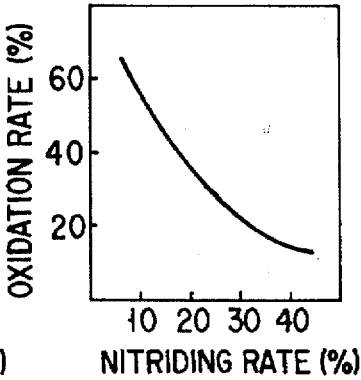
FIG. 14 is a graph showing a relationship between nitriding rate and oxidation rate in the semiconductor device shown in FIGS. 12A to 12C.
Figure 15:
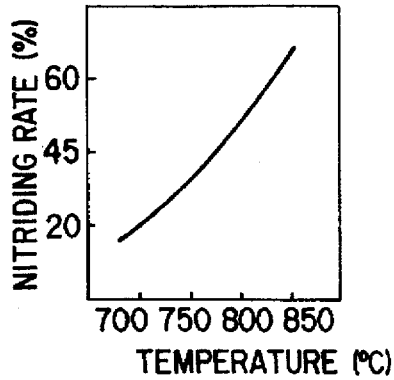
FIG. 15 is a graph showing a relationship between heat treatment temperature and nitriding rate in the semiconductor device shown in FIGS. 12A to 12C.

FIG. 13 is a graph showing a relationship between capacitance and nitriding rate (the coefficient $x$ of $WN_x$ expressed by percentage) at the uppermost surface of the $WN_x$ lower electrode 43 in the capacitor manufactured by the method shown in FIGS. 12A to 12C. As shown in FIG. 13, the capacitance becomes higher as the nitriding rate in the surface of the $WN_x$ lower electrode 43 grows higher. FIG. 14 is a graph showing a relationship between the nitriding rate of the lower electrode 43 and oxidation resistance or oxidation rate (the coefficient $y$ of $WN_xO_y$ expressed by percentage). As shown in FIG. 14, the oxidation rate becomes lower or the oxidation resistance becomes higher as the nitriding rate grows higher. FIG. 15 is a graph showing a relationship between heat treatment temperature and the nitriding rate of the lower electrode 43. As shown in FIG. 15, the nitriding rate becomes higher as the temperature grows higher. In consideration of these result, it is understood that the nitriding rate of the lower electrode is increased and production of an oxide can be suppressed where the lower electrode 43 is heat-treated at a high temperature in a gas atmosphere containing nitrogen.

Note that, although ammonia is used as a gas introduced in the heat treatment in this embodiment, a similar effect can be achieved by using a gas containing nitrogen.

The thickness of a $WN_x$ layer in the upper and lower electrodes, which is in contact with the dielectric film, and the coefficient $x$ were examined in their preferable ranges as regards a capacitor used in an MMIC.

As a result, it has been found that the $WN_x$ layer in both the upper and lower electrodes should have a thickness of 1 nm or more. Since the entirety of the upper and lower electrodes can be made of $WN_x$, the upper limit in the thickness of the $WN_x$ layer is the thickness of each electrode. However, it is preferable to set the upper limit in the thickness of the $WN_x$ layer at almost the same as the thickness of the dielectric film. For example, the $WN_x$ layer is 1.2 times thicker than the dielectric film in the above described embodiments.

It has also been found that the coefficient $x$ should fall in a range of from 0.05 to 0.5, and preferably of from 0.1 to 0.5. As the coefficient $x$ is lower, the oxidation resistance of the $WN_x$ layer becomes lower. As the coefficient $x$ is higher, the electric resistance of the $WN_x$ layer becomes higher.

The above described embodiments relate to a capacitor used in an MMIC. The present invention is also applicable to a storage capacitor in a memory device using Si, such as a capacitor in a dynamic memory device. The present invention is further applicable to a capacitor in a semiconductor device arranged on a module substrate.

FIGS. 16A to 16D are cross sectional views showing a method in order of manufacturing a semiconductor dynamic memory device according to still another embodiment of the present invention.

Figure 16A:
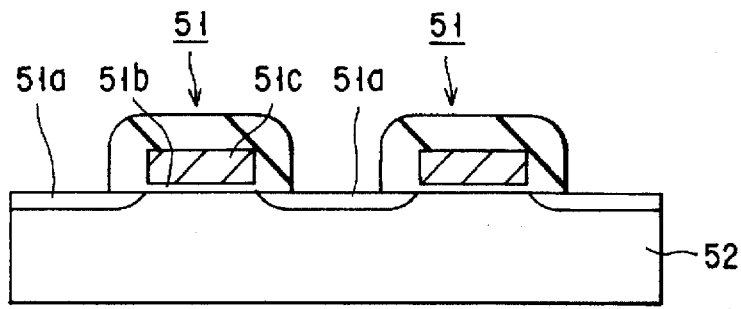
FIGS. 16A to 16D are cross sectional views showing a method in order of manufacturing a semiconductor memory device according to still another embodiment of the present invention.

At first, an MOS field effect transistor 51 functioning as a transfer gate is formed on an Si substrate 52 (FIG. 16A). The transistor 51 has source/drain diffusion layers 51a formed in a surface of the substrate 52, a gate electrode 51c formed via a gate insulating film 51b on the substrate 52 between the source/drain layers 51a.

Figure 16B:
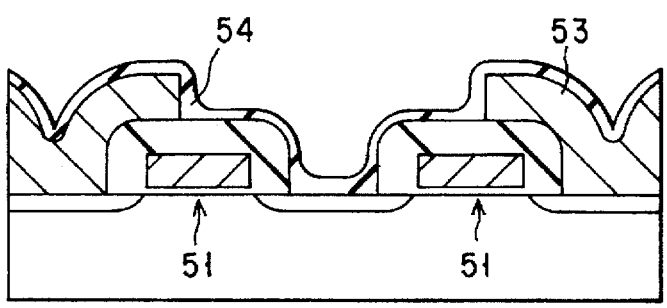

Then, a $WN_x$ film is deposited and etched, so that a storage node electrode or lower electrode 53 of a capacitor 50 is formed. A dielectric film 54 made of STO is then deposited overall (FIG. 16B).

Figure 16C:
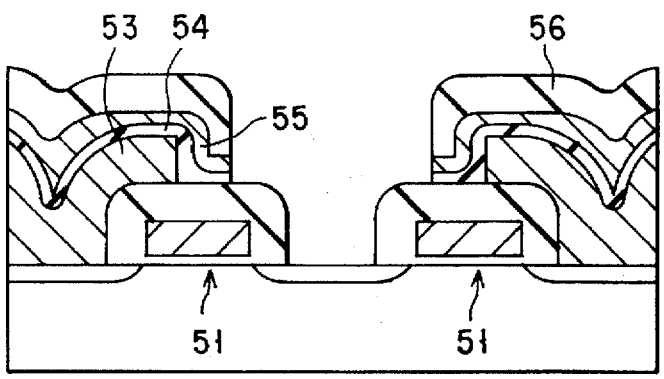

Then, a $WN_x$ film 55 to be a plate electrode or upper electrode and an insulating film 56 made of an $SiO_2$ are deposited overall in succession. The dielectric film 54, $WN_x$ film 55, and insulating film 56 are etched, using the same mask (FIG. 16C).

Figure 16D:
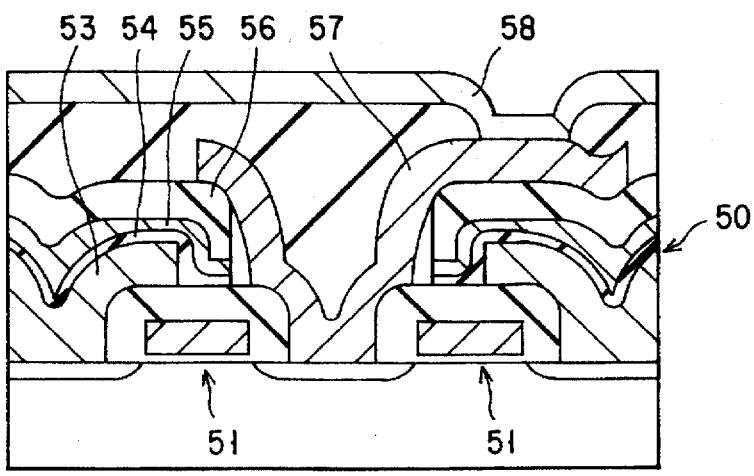

Then, a metal wiring layer 57 to be connected to a bit line, and an inter-level insulating film 58 and the bit line 59 are formed (FIG. 16D).

Note that peripheral circuits, such as a decoder circuit connected to the transistor 52 for selecting an elemental device, and a sense amplifier circuit connected to the bit line 59 for reading data from an elemental device, are formed in conventional steps, though the circuits are not shown.

The thickness of a $WN_x$ layer in the upper and lower electrodes, which is in contact with the dielectric film, and the coefficient $x$ were examined in their preferable ranges as regards a capacitor used in a semiconductor memory device.

As a result, it has been found that the $WN_x$ layer in both the upper and lower electrodes should have a thickness of 1 nm or more. Since the entirety of the upper and lower electrodes can be made of $WN_x$, the upper limit in the thickness of the $WN_x$ layer is the thickness of each electrode. However, it is preferable to set the upper limit in the thickness of the $WN_x$ layer at almost the same as the thickness of the dielectric film.

It has also been found that some effect can be obtained where the coefficient $x$ falls in a range of from 0.05 to 0.5, as in a capacitor used in an MMIC. However, criteria for a memory device capacitor should be more severe than those for an MMIC capacitor. In this sense, the coefficient $x$ preferably falls in a range of from 0.3 to 0.5 for the lower electrode which is exposed to a severe oxidation atmosphere in a manufacturing process. On the other hand, the coefficient $x$ preferably falls in a range of from 0.1 to 0.5 for the upper electrode. As the coefficient $x$ is lower, the oxidation resistance of the $WN_x$ layer becomes lower. As the coefficient $x$ is higher, the electric resistance of the $WN_x$ layer becomes higher.

Figure 17:
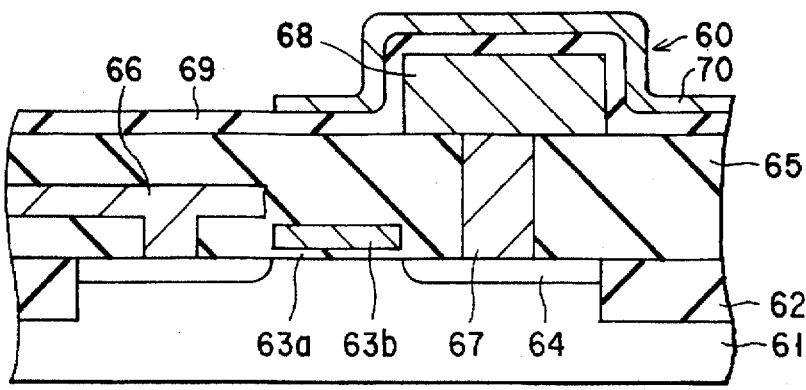
FIG. 17 is a cross sectional view showing a semiconductor memory device according to still another embodiment of the present invention.

FIG. 17 is a cross sectional view showing a semiconductor memory device according to still another embodiment of the present invention.

In order to manufacture the device shown in FIG. 17, at first, an inter-device isolation region 62, a gate insulating film 63a, a gate electrode or word line 63b, an $n^+$-diffusion layer 64, a bit line 66, and an inter-level insulating film 65 are formed in or on a p-silicon substrate. Then, a contact hole is formed in the inter-level insulating film 65, and an $n^+$-polysilicon film 67 is formed overall. That part of the $n^+$-polysilicon film 67, which is on the inter-level insulating film 65, is removed by means of etching back or chemical and mechanical polishing, so that the silicon film 67 is left only in the contact hole.

Then, a $WN_x$ film 68 is formed by means of a chemical sputtering method or CVD method, and is patterned to be a lower electrode. Since the lower electrode is formed of the $WN_x$ film 68 other than a precious metal, such as Pt, it is easily patterned. A dielectric film 69 and an upper electrode 70 are then formed. As described above, the dielectric film 69 is made of a highly dielectric substance of metal oxide, such as $SrTiO_3$ (STO), $Ba_xSr_{1-x}TiO_3$ (BSTO), $Ta_2O_5$, $PbZr_xTi_{1-x}O_3$, or $Pb_xLa_{1-x}Zr_yTi_{1-y}O_3$. By doing so, a storage capacitor 60 which has the lower electrode 68, dielectric film 69, and upper electrode 70, and is connected to the $n^+$-diffusion layer 64, is manufactured.

Figure 18:
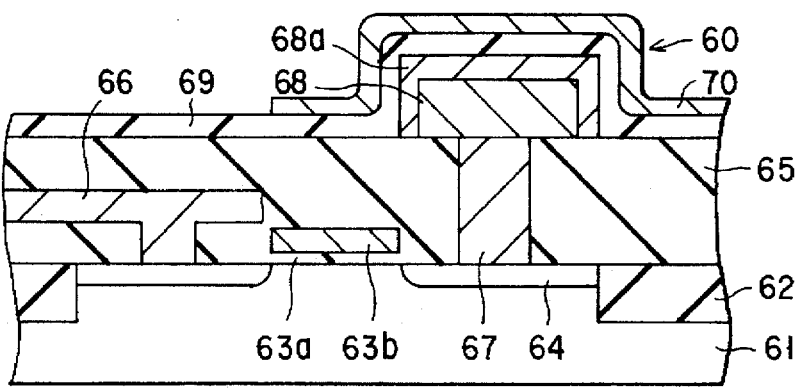
FIG. 18 is a cross sectional view showing a semiconductor memory device according to still another embodiment of the present invention.

FIG. 18 is a cross sectional view showing a semiconductor memory device according to still another embodiment of the present invention.

The device shown in FIG. 18 is similar to the device shown in FIG. 17, but is different therefrom in that a surface of a lower electrode is heat-treated at a temperature of from 500° C. to 900° C. in an atmosphere containing ammonia after a $WN_x$ film 68 is patterned to be the lower electrode, so that a nitrogen rich film 68a having a $WN_2$ crystalline structure is formed in the surface of the lower electrode. Note that the entirety of the lower electrode may be formed of the nitrogen rich film 68a having a $WN_2$ crystalline structure where nitriding sufficiently proceeds.

Figure 19:
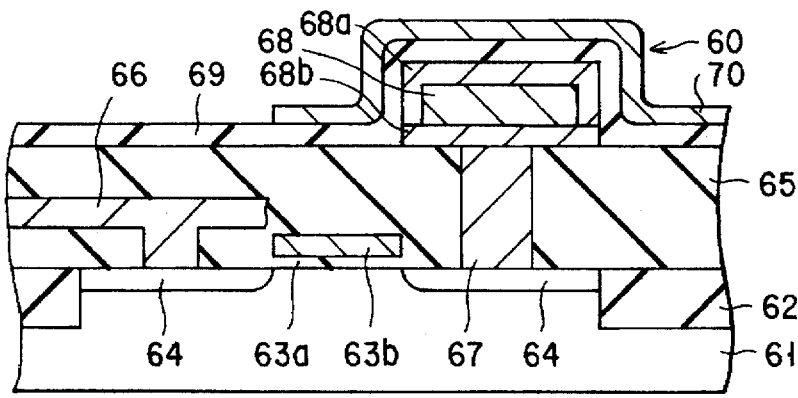
FIG. 19 is a cross sectional view showing a semiconductor memory device according to still another embodiment of the present invention.

FIG. 19 is a cross sectional view showing a semiconductor memory device according to still another embodiment of the present invention.

The device shown in FIG. 19 is similar to the device shown in FIG. 18, but is different therefrom in that a $WN_x$ film rich in nitrogen, i.e., a nitrogen rich film 68b is formed in a atmosphere richly containing nitrogen at the beginning of formation of a $WN_x$ film 68. In addition, a nitrogen rich film 68a having a $WN_2$ crystalline structure is formed in a surface of the $WN_x$ film 68 by treating the $WN_x$ film 68 on the conditions as described in relation to the device shown FIG. 18. The nitrogen rich film 68b may be formed by means of a sputtering method performed in an atmosphere containing nitrogen at a high rate, or a CVD method performed in an atmosphere containing a nitriding gas, such as $NH_3$, at a high rate. Note that the entirety of the lower electrode may be formed of the nitrogen rich film 68a having a $WN_2$ crystalline structure where nitriding sufficiently proceeds.

Figure 20:
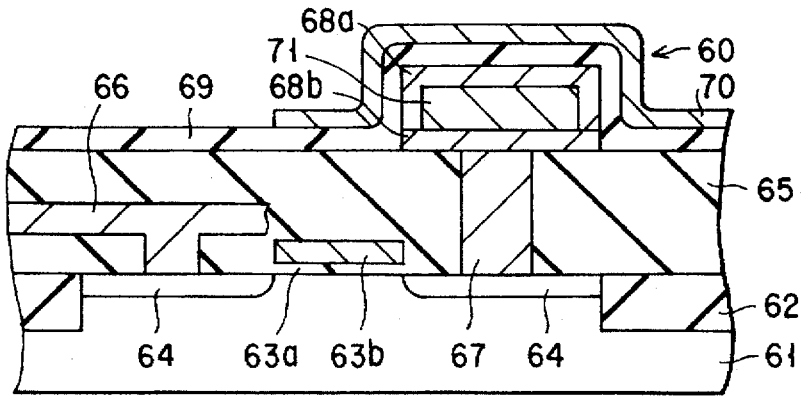
FIG. 20 is a cross sectional view showing a semiconductor memory device according to still another embodiment of the present invention.

FIG. 20 is a cross sectional view showing a semiconductor memory device according to still another embodiment of the present invention.

The device shown in FIG. 20 is similar to the device shown in FIG. 19, but is different therefrom in that a W film 71 is deposited after a $WN_x$ film 68b rich in nitrogen is deposited. In addition, a nitrogen rich film 68a having a $WN_2$ crystalline structure is formed in a surface of the W film 71 by treating the W film 71 on the conditions as described in relation to the device shown FIG. 18.

Figure 21:
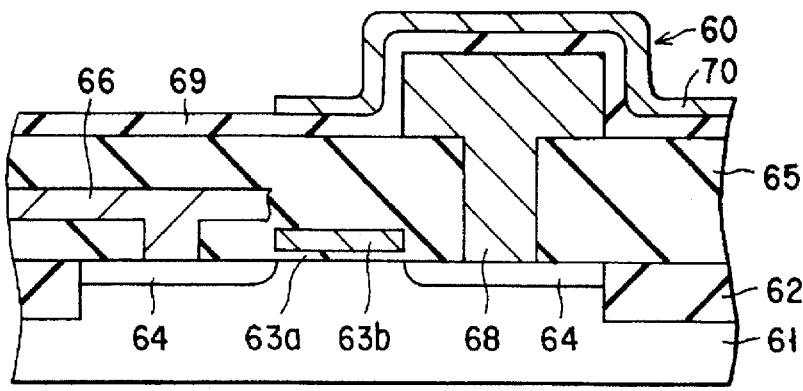
FIG. 21 is a cross sectional view showing a semiconductor memory device according to still another embodiment of the present invention.

FIG. 21 is a cross sectional view showing a semiconductor memory device according to still another embodiment of the present invention.

The device shown in FIG. 21 is similar to the device shown in FIG. 17, but is different therefrom in that a portion embedded in a contact hole for connecting an $n^+$-diffusion layer 64 and the lower electrode of a capacitor 60 is integratedly formed with a $WN_x$ film 68 which is to be the lower electrode.

Figure 22:
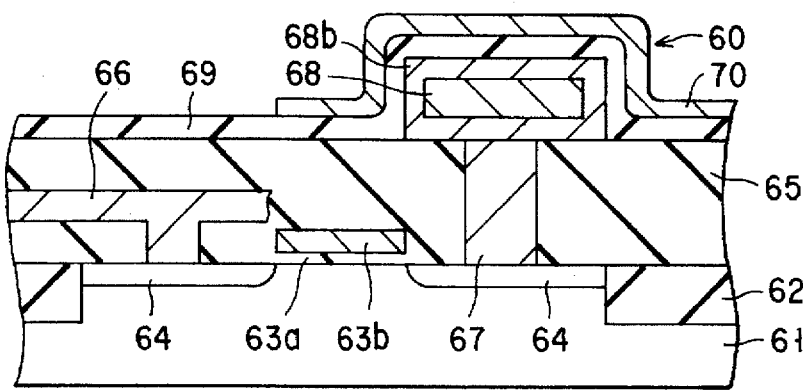
FIG. 22 is a cross sectional view showing a semiconductor memory device according to still another embodiment of the present invention.

FIG. 22 is a cross sectional view showing a semiconductor memory device according to still another embodiment of the present invention.

The device shown in FIG. 22 is similar to the device shown in FIG. 17, but is different therefrom in that the lower electrode of a capacitor 60 is formed of a $WN_x$ film 68 and a $WN_x$ film 68a rich in nitrogen and covering the lower, side and upper surfaces of the film 68.

Figure 23:
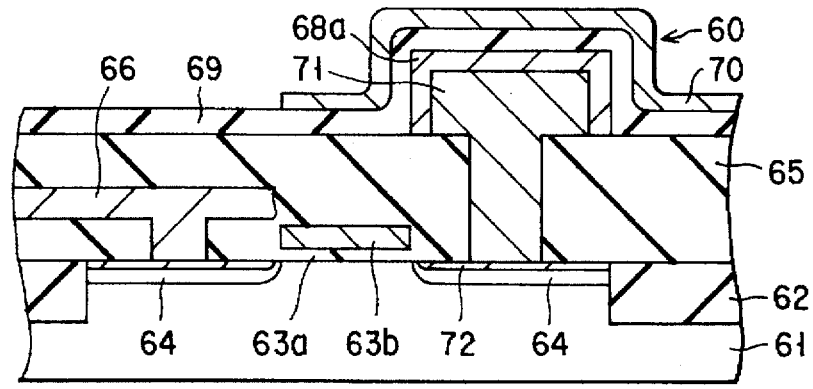
FIG. 23 is a cross sectional view showing a semiconductor memory device according to still another embodiment of the present invention.

FIG. 23 is a cross sectional view showing a semiconductor memory device according to still another embodiment of the present invention.

The device shown in FIG. 23 is similar to the device shown in FIG. 17, but is different therefrom in several points.

In order to manufacture the device shown in FIG. 23, a $TiSi_2$ film is formed in the surface a self alignment diffusion layer 64 before an inter-level insulating film 65 is formed. A bit line 66 and the inter-level insulating film 65 are then formed, and a contact hole is formed in the inter-level insulating film 65. A W film 71 is deposited so as to fill the contact hole, and patterned to be a lower electrode. In addition, a nitrogen rich film 68a having a $WN_2$ crystalline structure is formed in a surface of the W film 71 by treating the W film 71 on the conditions as described in relation to the device shown FIG. 18.

Figure 24:
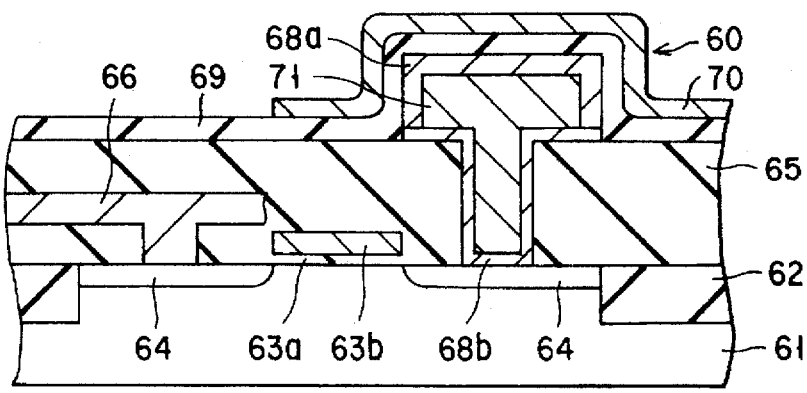
FIG. 24 is a cross sectional view showing a semiconductor memory device according to still another embodiment of the present invention.

FIG. 24 is a cross sectional view showing a semiconductor memory device according to still another embodiment of the present invention.

The device shown in FIG. 24 is similar to the device shown in FIG. 17, but is different therefrom in several points. In order to manufacture the device shown in FIG. 24, the inner surface of a contact hole is covered with a $WN_x$ film 68b rich in nitrogen after the contact hole is formed in an inter-level insulating film 65. A W film 71 is deposited so as to fill the contact hole, and patterned to be a lower electrode. In addition, a nitrogen rich film 68a having a $WN_2$ crystalline structure is formed in a surface of the W film 71 by treating the W film 71 on the conditions as described in relation to the device shown FIG. 18.

As described above, these embodiments are characterized in that that surface of at least one of upper and lower electrodes, which is in contact with a dielectric film, is defined by a $WN_x$ layer. The surface of each electrode opposite to the $WN_x$ layer is in contact with an inter-level insulating film, metal wiring layer, or the like. Where each electrode is in contact with an inter-level insulating film or metal wiring layer, it is possible to improve adhesion by interposing a Ti layer at the interface. However, in this case, the Ti layer and $WN_x$ layer react with each other in particular during a heat treatment, thereby increasing the electric resistance of the electrode, and degrading the characteristics of a capacitor as the case may be.

In consideration of the problem, the electrode may be formed of a multi-layer structure consisting of three layers or more to be thermally stable, wherein the $WN_x$ layer and Ti layer are arranged in a surface in contact with the dielectric film and in a surface opposite thereto, respectively, and a barrier metal layer is arrange between the $WN_x$ layer and Ti layer so as to prevent their interaction. The barrier metal layer may be made of Mo, Ti, their nitride or their silicide. Such a multi-layer structure in an electrode is effective where that surface of the electrode, which is in contact with a dielectric film, is formed of a conventional material, such as Pt, other than $WN_x$.

FIGS. 25A to 25D are cross sectional views showing a method in order of manufacturing a semiconductor device (capacitor used in an MMIC) according to still another embodiment of the present invention. In this embodiment, an electrode having a multi-layer structure described above is employed.

At first, an insulating film, such as an $SiO_2$ film 82, is formed on a semiconductor substrate, such as a semi-insulating GaAs substrate 81, by means of a CVD method.

Figure 25A:
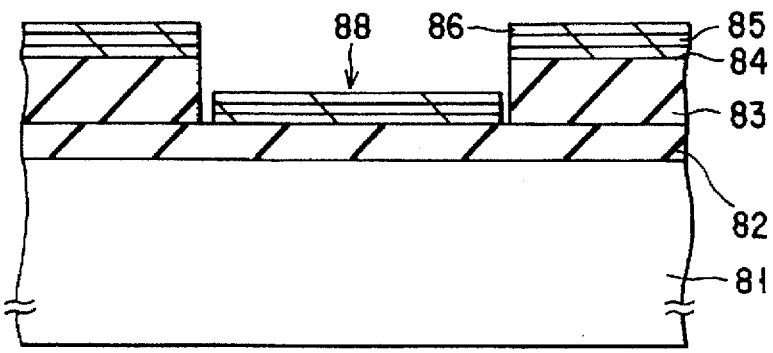
FIGS. 25A to 25D are cross sectional views showing a method in order of manufacturing a semiconductor device according to still another embodiment of the present invention.

Then, a multi-layer film consisting of a Ti layer 84, an Mo layer 85, and a $WN_x$ layer 86 in this order from underside is deposited, using a photo-resist mask 83 (FIG. 25A).

Figure 25B:
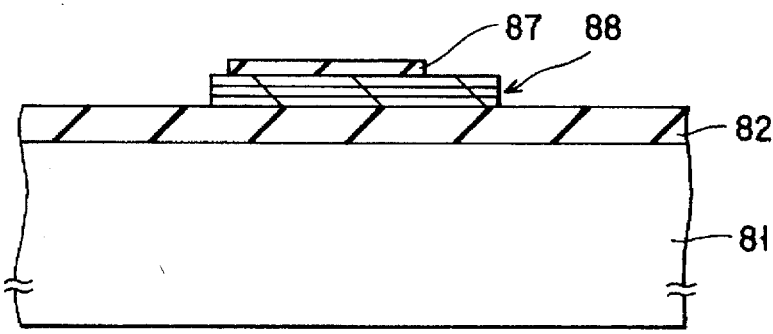

Then, the photo-resist mask 83 and an unnecessary part of the multi-layer film on the mask 83 are removed by means of a lift-off method, so that a lower electrode 88 is formed. An STO film is then deposited at a substrate temperature of 600° C. by means of, e.g., a sputtering method. The STO film is patterned by means of RIE, using a photo-resist mask, so that a dielectric film 87 is formed (FIG. 25B).

Figure 25C:
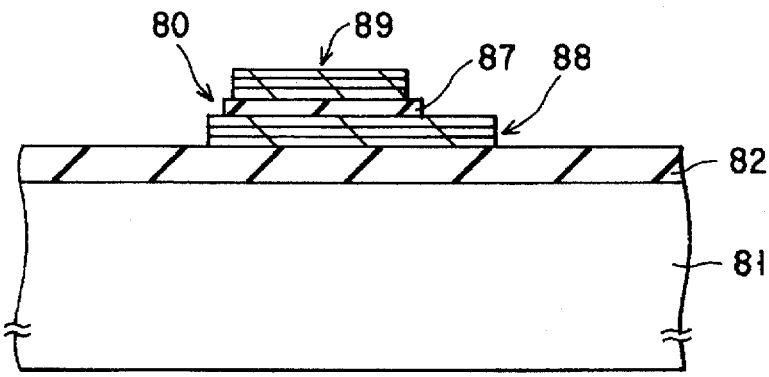

After the photo-resist mask 83 is removed, a multi-layer film consisting of the $WN_x$ layer, an Mo layer, and a Ti layer in this order from underside is deposited and patterned, using the same method as the lower electrode 88, so that an upper electrode 89 is formed (FIG. 25C).

Figure 25D:
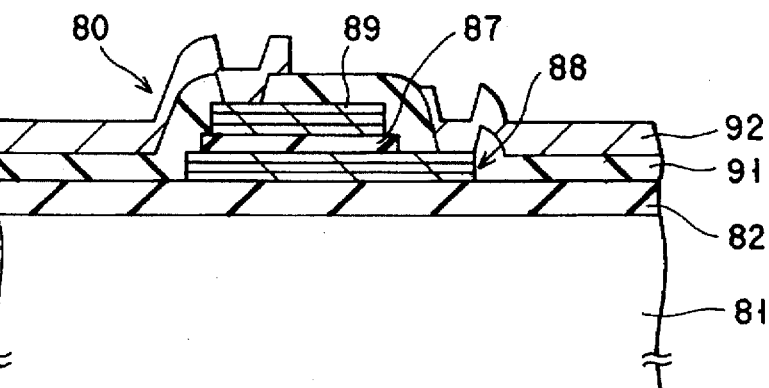

Then, an inter-level insulating film 91 is deposited and contact holes are formed. Wiring layers 92 made of Au are connected to the upper and lower electrodes 87 and 89, so that the capacitor 80 is electrically connected to other elemental devices in the MMIC (FIG. 25D).

Note that, although a sputtering method is used at a substrate temperature of 600° C. when the STO film is formed in this embodiment, a sol-gel method may be used instead. Since the electrodes of this embodiment is stable, the characteristics of the capacitor are not deteriorated even if a heat treatment of 600° C. or more is carried out after the STO film is applied by means of a sol-gel method.

FIGS. 26A to 26E are cross sectional views showing a method in order of manufacturing a semiconductor device (capacitor used in an MMIC) according to still another embodiment of the present invention.

Figure 26A:
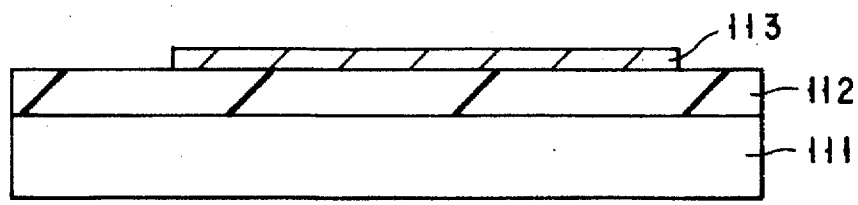
FIGS. 26A to 26E are cross sectional views showing a method in order of manufacturing a semiconductor device according to still another embodiment of the present invention.
Figure 26B:
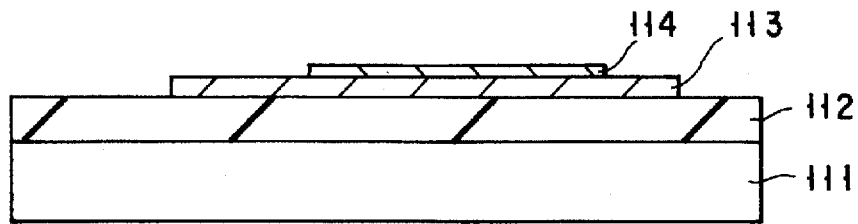
Figure 26C:
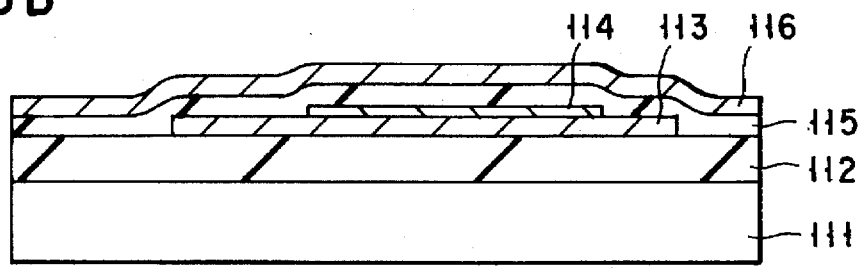
Figure 26D:
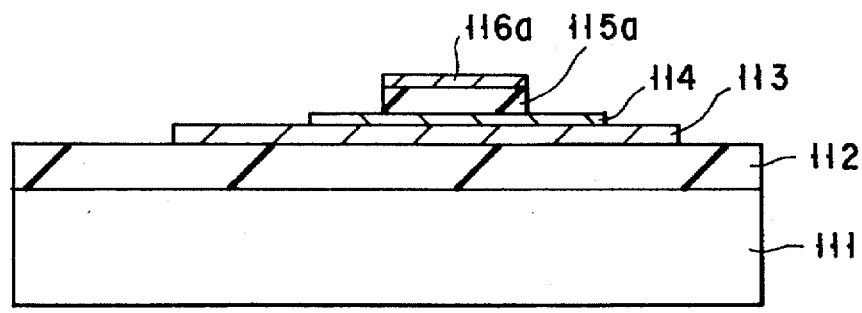
Figure 26E:
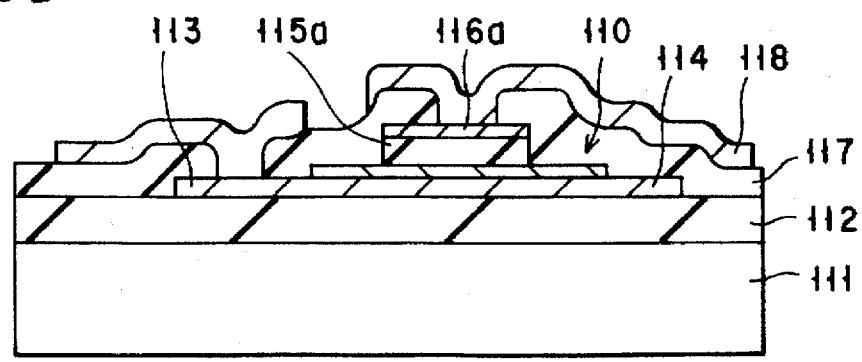

As shown in FIG. 26E, an $SiO_2$ film 112 and a first wiring layer 113 are arranged in this order on a GaAs substrate 111. A capacitor 110 is formed on the first wiring layer 113. The capacitor 110 includes a lower electrode 114 which has a multi-layer structure consisting of a Ti layer (5 nm), an Mo layer (50 nm), and a Pt layer (400 nm) in this order from underside. The capacitor 110 also includes a dielectric film 115a made of strontium titanate (STO). The capacitor 110 further includes an upper electrode 116a made of an alloy (WAl) of tungsten and aluminum.

A method of the semiconductor device according to this embodiment will be described.

At first, the $SiO_2$ film 112 is formed on the GaAs substrate by means of a CVD (Chemical Vapor Deposition) method. The first wiring layer 113 made of a metal, such as Au, is then formed by means of a lift-off method (FIG. 26A).

Then, a multi-layer film consisting of the Ti layer (5 nm), the Mo layer (50 nm), and the Pt layer (400 nm) in this order from underside is formed on the first wiring layer 113 by means of an E-GUN method. The multi-layer film is patterned, using a resist pattern formed by means of photolithography as a mask, and the lower electrode 114 is formed by means of a lift-off method (FIG. 26B).

Then, an STO film 115 is deposited up to 100 nm on the lower electrode 114 by means of a reactive sputtering method performed in an oxygen atmosphere. A metal film or WAl film 116 made of an alloy of tungsten and aluminum is then deposited by means of a reactive sputtering method with the substrate heated at 300° C. (FIG. 26C).

Then, the STO film 115 and WAl film 116 are patterned by means of a reactive ion etching method, using a resist pattern formed by means of photolithography as a mask, so that the dielectric film 115a and upper electrode 116a are formed (FIG. 26D).

Then, an inter-level insulating film 117 made of, e.g., $SiO_2$ is deposited up to 600 nm by means of a CVD method. Contact holes are then formed by means of an RIE method, and wiring layers 118 made of, e.g., Au are connected to the upper and lower electrodes, so that the capacitor 110 is electrically connected to other elemental devices in the IC (FIG. 26E).

Since the metal film 116 to be the upper electrode 116a is formed of WAl, a reaction product is hardly produced at the interface between the metal film 116 and STO film 115 when the metal film 116 is formed. Furthermore, since WAl has a low electric resistance, it is suitable to be used for microwave. Where $TiN_x$ was used in place of WAl, the dielectric constant of the device was lowered down to one tenth or less.

The lower electrode 114 may preferably employ WAl, though only the upper electrode 116a employs WAl in this embodiment. In this case, patterning of all the lower electrode 114, dielectric film 115a, and upper electrode 116a can be performed by means of RIE, so that the manufacturing process is simplified, and miniaturization is achieved.

Figure 27A:
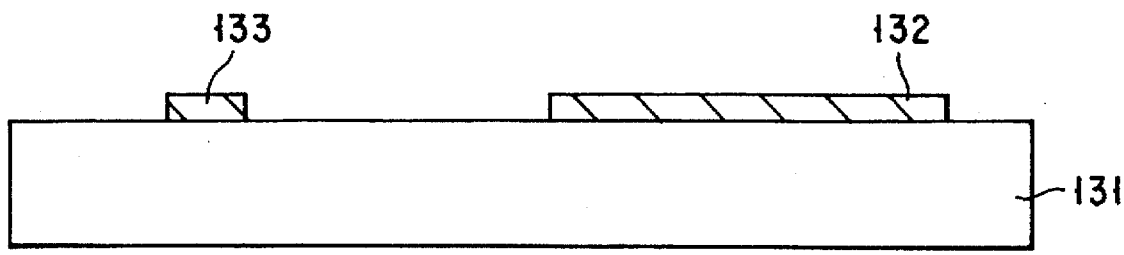
FIGS. 27A to 27C are cross sectional views showing a method in order of manufacturing a semiconductor device according to still another embodiment of the present invention.
Figure 27B:
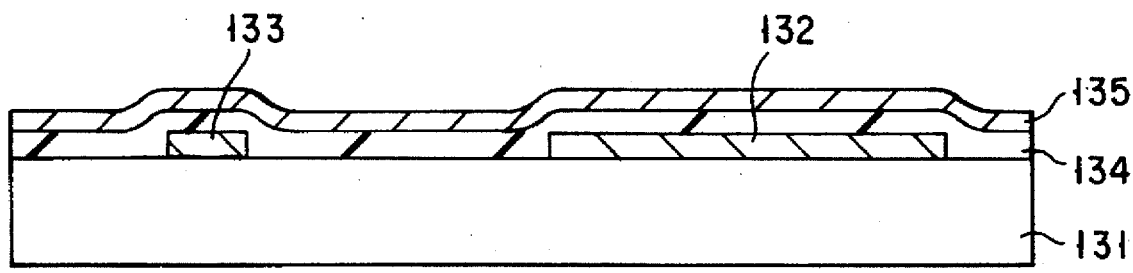
Figure 27C:
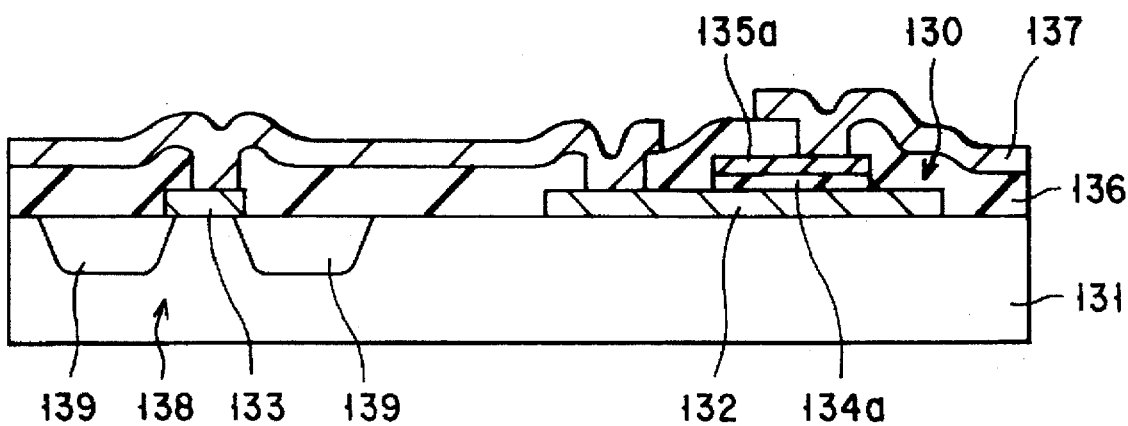

FIGS. 27A to 27C are cross sectional views showing a method in order of manufacturing a semiconductor device according to still another embodiment of the present invention. This embodiment relates to an MMIC in which WAl is employed in the lower electrode of a capacitor and the gate electrode of an FET.

At first, a WAl film to be the electrodes is deposited up to 300 nm on a GaAs substrate 131 by means of a cold sputtering method. The WAl film is patterned by means of RIE, using a resist pattern (not shown), so that a gate electrode 133 of an FET and a lower electrode 132 of an MIM capacitor are formed at a time (FIG. 27A). The reason why the electrodes 132 and 133 are made of WAl is that this material is excellent as a material of the Schottky gate electrode and the lower electrode of a capacitor.

Then, an STO film 134 (100 nm) is deposited by means of a reactive sputtering method performed in an oxygen atmosphere. A WAl film 135 to be an upper electrode is then deposited by means of a reactive sputtering method with the substrate heated at 300° C. (FIG. 27B).

Then, the STO film 134 and WAl film 135 are patterned by means of a reactive ion etching method, so that a dielectric film 134a and an upper electrode 135a are formed. The capacitor is then heat-treated at 500° C. so as to facilitate crystallization of STO. After that, steps for forming the FET 138 are carried out.

Then, an inter-level insulating film 136 made of, e.g., $SiO_2$ is deposited up to 600 nm. Contact holes are then formed and wiring layers 137 are arranged (FIG. 27C). In this step, openings (not shown) are formed in the inter-level insulating film 136 down to source/drain diffusion layers 139 of the transistor 138 by means of an RIE method. Ohmic electrodes are then arranged by forming a film made of a metal or alloy, such as AuGe, by means of a lift-off method, using the inter-level insulating film 136 having the openings as a spacer.

In this embodiment, the dielectric film 134a and upper electrode 135a of the capacitor 130 are formed before formation of the ohmic electrode made of, e.g., AuGe, which would be deteriorated at a temperature of 400° C. or more. Sequentially, thermal stability of the WAl electrode is utilized so that the capacitor is heat-treated at a temperature of 400° C. or more, and preferably of 600° C. or more. By performing this heat treatment, crystallization of STO and decrease in oxygen defect proceed so that the dielectric constant of the device is improved. This heat treatment may be performed after the STO film is formed overall and before the upper electrode is formed. Instead, this heat treatment may be performed along with a heat treatment for activating an ion-implanted layer of the FET in common. In this case, the heat treatment is carried out at a temperature at about 800° C.

According to a conventional method, the transistor is formed before the capacitor is formed, and thus no heat treatment of the dielectric film can be performed for fear of deteriorating the ohmic electrode. In addition, where the heat resistance of the upper and lower electrodes are inferior, no heat treatment of the dielectric film can be performed. In contrast, however, where WAl is employed in the Schottky gate electrode and capacitor electrode, and the MIM capacitor is formed in advance, it is possible to heat-treat the dielectric film in order to improve the dielectric constant.

FIGS. 28A to 28D are cross sectional views showing a method in order of manufacturing a semiconductor dynamic memory device according to still another embodiment of the present invention.

Figure 28A:
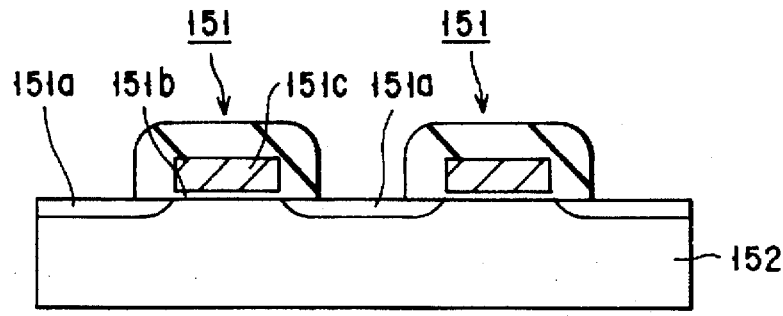
FIGS. 28A to 28D are cross sectional views showing a method in order of manufacturing a semiconductor memory device according to still another embodiment of the present invention.

At first, an MOS field effect transistor 151 functioning as a transfer gate is formed on an Si substrate 152 (FIG. 28A). The transistor 151 has source/drain diffusion layers 151a formed in a surface of the substrate 152, a gate electrode 151c formed via a gate insulating film 151b on the substrate 152 between the source/drain layers 151a.

Figure 28B:
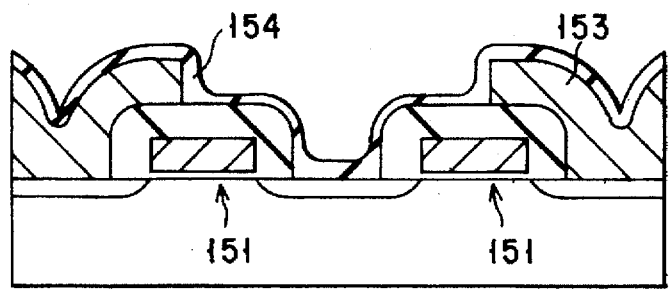

Then, a WAl film is deposited and etched, so that a storage node electrode or lower electrode 153 of a capacitor 150 is formed. A dielectric film 154 made of STO is then deposited overall (FIG. 28B).

Figure 28C:
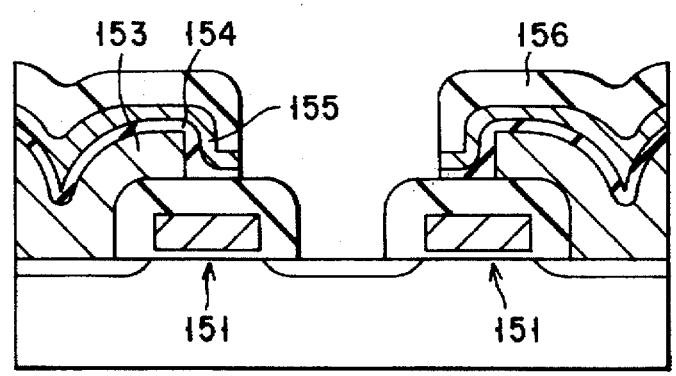

Then, a WAl film 155 to be a plate electrode or upper electrode and an insulating film 156 made of an $SiO_2$ are deposited overall in succession. The dielectric film 154, WAl film 155, and insulating film 156 are etched, using the same mask (FIG. 28C).

Figure 28D:
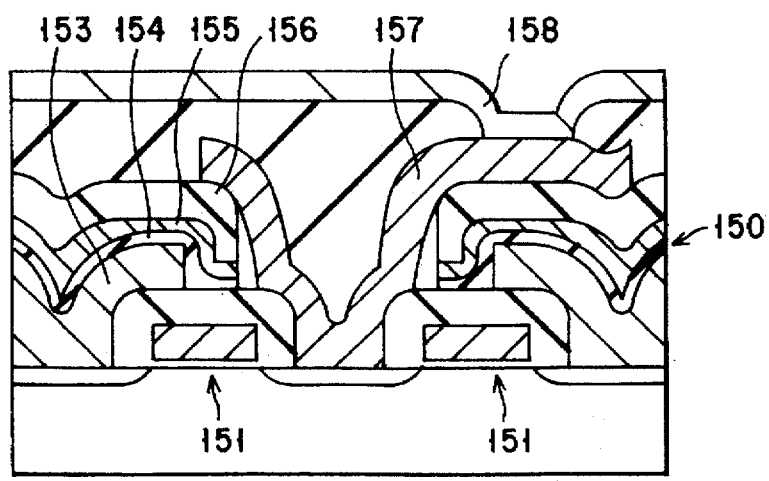

Then, a metal wiring layer 157 to be connected to a bit line, and an inter-level insulating film 158 and the bit line 159 are formed (FIG. 28D).

Note that peripheral circuits, such as a decoder circuit connected to the transistor 152 for selecting an elemental device, and a sense amplifier circuit connected to the bit line 159 for reading data from an elemental device, are formed in conventional steps, though the circuits are not shown.

FIGS. 29A to 29D are cross sectional views showing a method in order of manufacturing a semiconductor device (capacitor used in an MMIC) according to still another embodiment of the present invention. In this embodiment, an electrode having a multi-layer structure is employed for the purpose of achieving the same effect as the structure shown in FIGS. 25A to 25D.

At first, an insulating film, such as an $SiO_2$ film 182, is formed on a semiconductor substrate, such as a semi-insulating GaAs substrate 181, by means of a CVD method.

Then, a multi-layer film consisting of a Ti layer 184, an Mo layer 185, and a WAl layer 186 in this order from underside is deposited, using a photo-resist mask 183 (FIG. 29A).

Then, the photo-resist mask 183 and an unnecessary part of the multi-layer film on the mask 183 are removed by means of a lift-off method, so that a lower electrode 188 is formed. An STO film is then deposited at a substrate temperature of 600° C. by means of, e.g., a sputtering method. The STO film is patterned by means of RIE, using a photo-resist mask, so that a dielectric film 187 is formed (FIG. 29B).

After the photo-resist mask 183 is removed, a multi-layer film consisting of the WAl layer, an Mo layer, and a Ti layer in this order from underside is deposited and patterned, using the same method as the lower electrode 188, so that an upper electrode 189 is formed (FIG. 29C).

Then, an inter-level insulating film 191 is deposited and contact holes are formed. Wiring layers 192 made of Au are connected to the upper and lower electrodes 187 and 189, so that the capacitor 180 is electrically connected to other elemental devices in the MMIC (FIG. 29D).

Note that, although a sputtering method is used at a substrate temperature of 600° C. when the STO film is formed in this embodiment, a sol-gel method may be used instead. Since the electrodes of this embodiment is stable, the characteristics of the capacitor are not deteriorated even if a heat treatment of 600° C. or more is carried out after the STO film is applied by means of a sol-gel method.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising a capacitor having first and second electrodes, a dielectric film comprising an oxide interposed between said electrodes, and a first contacting surface comprising tungsten nitride interposed between, and contacting, both said dielectric film and said first electrode, wherein said tungsten nitride of said first contacting surface is expressed by $WN_x$ and its coefficient $x$ falls in a range of from 0.05 to 0.5.

2. The device according to claim 1, wherein said second electrode is in contact with said dielectric film by a second contacting surface comprising tungsten nitride.

3. The device according to claim 1, wherein said first electrode includes a tungsten nitride layer, a titanium nitride layer, and a barrier metal layer interposed between said tungsten nitride layer and titanium nitride layer, said first contacting surface being said tungsten nitride layer.

4. The device according to claim 1, wherein said dielectric film is made of a perovskite dielectric substance.

5. The device according to claim 4, wherein said capacitor is designed to be used at a frequency of 800 MHz or more, and said perovskite dielectric substance is paraelectric.

6. The device according to claim 5, wherein said perovskite dielectric substance contains strontium.

* * * * *